US006611454B2

(12) United States Patent
Hidaka

(10) Patent No.: US 6,611,454 B2
(45) Date of Patent: Aug. 26, 2003

(54) THIN FILM MAGNETIC MEMORY DEVICE WRITING DATA OF A PLURALITY OF BITS IN PARALLEL

(75) Inventor: Hideto Hidaka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 47 days.

(21) Appl. No.: 09/929,054

(22) Filed: Aug. 15, 2001

(65) Prior Publication Data
US 2002/0135018 A1 Sep. 26, 2002

(30) Foreign Application Priority Data

Mar. 23, 2001 (JP) ........................................ 2001-085233

(51) Int. Cl.⁷ .............................................. G11C 11/14
(52) U.S. Cl. ................. 365/171; 365/189.04; 365/190; 365/198; 365/220; 365/230.03; 365/230.06
(58) Field of Search ........................... 365/171, 189.04, 365/190, 198, 220, 230.03, 230.06

(56) References Cited

U.S. PATENT DOCUMENTS 3,593,322 A * 7/1971 Morris
5,640,343 A   6/1997 Gallagher et al.
6,081,445 A   6/2000 Shi et al.
6,236,611 B1 * 5/2001 Naji

OTHER PUBLICATIONS

"A 10ns Read and Write Non–Volatile Memory Array Using a Magnetic Tunnel Junction and FET Switch in each Cell", Scheuerlein et al., ISSCC Digest of Technical Papers, TA7.2, Feb. 2000, pp. 94–95, 128–129, 409–410.

"Nonvolatile RAM based on Magnetic Tunnel Junction Elements", Durlam et al., ISCC Digest of Technical Papers, TA7.3, Feb. 2000, pp. 96–97, 130–131, 410–411.

"Magnetic Random Access Memory (MRAM)", Numata et al., Technical Report of IEICE, Mar. 2000, pp. 13–18.

Related U.S. application Ser. No. 09/887,321, filed Jun. 25, 2001 (Our Ref. No. 57454–137).

Related U.S. application Ser. No. 09/834,638, filed Apr. 16, 2001 (Our Ref. No. 57454–075).

Related U.S. application Ser. No. 09/805,043, filed Mar. 14, 2001 (Our Ref No. 57454–039).

Related U.S. application Ser. No. 09/832,025, filed Apr. 11, 2001 (Our Ref. No. 57454–070).

Related U.S. application Ser. No. 09/852,087, filed May 10, 2001 (Our Ref. No. 57454–111).

* cited by examiner

Primary Examiner—VanThu Nguyen
(74) Attorney, Agent, or Firm—McDermott, Will & Emery

(57) ABSTRACT

A memory array is divided into a plurality of memory blocks each having a plurality of bit line pairs. In the memory block selected for a data write operation, first and second selection gates are turned ON so as to couple first and second nodes to the power supply voltage and the ground voltage, respectively. In the data write operation, complementary bit lines of the same bit line pair are electrically coupled to each other through a bit-line coupling transistor. A bit-line current switching portion connects a plurality of bit line pairs in series between the first and second nodes so that the directions of reciprocating-current paths respectively formed in the plurality of bit line pairs correspond to the respective data levels of a plurality of bits.

22 Claims, 21 Drawing Sheets

MCDD

US 6,611,454 B2

THIN FILM MAGNETIC MEMORY DEVICE WRITING DATA OF A PLURALITY OF BITS IN PARALLEL

BACKGROUND OF THE INVENTION

1. Field of the Invention

The present invention generally relates to a thin film magnetic memory device. More particularly, the present invention relates to a thin film magnetic memory device including magnetic memory cells whose electric resistance value varies according to the level of storage data written by a magnetic field produced by a data write current.

2. Description of the Background Art

An MRAM (Magnetic Random Access Memory) device has attracted attention as a memory device capable of non-volatile data storage with low power consumption. The MRAM device is a memory device that stores data in a non-volatile manner using a plurality of thin film magnetic elements formed in a semiconductor integrated circuit and is capable of random access to each thin film magnetic element.

In particular, recent announcement shows that the performance of the MRAM device is significantly improved by using thin film magnetic elements having a magnetic tunnel junction (MTJ) as memory cells. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 23 is a schematic diagram showing the structure of a magnetic memory cell having a magnetic tunnel junction (hereinafter, also simply referred to as "MTJ memory cell").

Referring to FIG. 23, the MTJ memory cell includes a magnetic tunnel junction MTJ having its resistance value varying according to the storage data level, and an access transistor ATR. The access transistor ATR is formed from a field effect transistor (FET), and is coupled between the magnetic tunnel junction MTJ and the ground voltage Vss.

For the MTJ memory cell are provided a write word line WWL for instructing a data write operation, a read word line RWL for instructing a data read operation, and a bit line BL serving as a data line for transmitting an electric signal corresponding to the storage data level in the data read and write operations.

FIG. 24 is a conceptual diagram illustrating the data read operation from the MTJ memory cell.

Referring to FIG. 24, the magnetic tunnel junction MTJ has a magnetic layer FL having a fixed magnetic field of a fixed direction (hereinafter, also simply referred to as "fixed magnetic layer FL"), and a magnetic layer VL having a free magnetic field (hereinafter, also simply referred to as "free magnetic layer VL"). A tunnel barrier TB formed from an insulator film is provided between the fixed magnetic layer FL and the free magnetic layer VL. According to the storage data level, either a magnetic field of the same direction as that of the fixed magnetic layer FL or a magnetic field of the direction different from that of the fixed magnetic layer FL has been written to the free magnetic layer VL in a non-volatile manner.

In the data read operation, the access transistor ATR is turned ON in response to activation of the read word line RWL. As a result, a sense current Is flows through a current path formed from the bit line BL, magnetic tunnel junction MTJ, access transistor ATR and ground voltage Vss. The sense current Is is supplied as a constant data read current from a not-shown data read circuit.

The electric resistance value of the magnetic tunnel junction MTJ varies according to the relative relation of the magnetic field direction between the fixed magnetic layer FL and the free magnetic layer VL. More specifically, when the fixed magnetic layer FL and the free magnetic layer VL have the same magnetic field direction, the magnetic tunnel junction MTJ has a smaller resistance value as compared to the case where both magnetic layers have different magnetic field directions.

Accordingly, in the data read operation, a voltage drop at the magnetic tunnel junction MTJ due to the sense current Is varies according to the magnetic field direction stored in the free magnetic layer VL. Thus, by starting supply of the sense current Is with the bit line BL precharged to a high voltage, the storage data in the MTJ memory cell can be read by sensing a change in voltage level on the bit line BL.

FIG. 25 is a conceptual diagram illustrating the data write operation to the MTJ memory cell.

Referring to FIG. 25, in the data write operation, the read word line RWL is inactivated, so that the access transistor ATR is turned OFF. In this state, a data write current for applying a magnetic field to the free magnetic layer VL is applied to the write word line WWL and the bit line BL. The magnetic field direction of the free magnetic layer VL is determined by combination of the respective directions of the data write current flowing through the write word line WWL and the bit line BL.

FIG. 26 is a conceptual diagram illustrating the relation between the respective directions of the data write current and the magnetic field in the data write operation.

Referring to FIG. 26, a magnetic field Hx of the abscissa indicates the direction of a magnetic field H(WWL) produced by the data write current flowing through the write word line WWL. A magnetic field Hy of the ordinate indicates the direction of a magnetic field H(BL) produced by the data write current flowing through the bit line BL.

The magnetic field direction stored in the free magnetic layer VL is updated only when the sum of the magnetic fields H(WWL) and H(BL) reaches the region outside the asteroid characteristic line shown in the figure. In other words, the magnetic field direction stored in the free magnetic layer VL is not updated when a magnetic field corresponding to the region inside the asteroid characteristic line is applied.

Accordingly, in order to update the storage data of the MTJ memory cell by the data write operation, a current must be applied to both the write word line WWL and the bit line BL. Once the magnetic field direction, i.e., the storage data, is stored in the magnetic tunnel junction MTJ, it is retained therein in a non-volatile manner until another data read operation is conducted.

The sense current Is flows through the bit line BL in the data read operation. However, the sense current Is is generally set to a value that is smaller than the data write current by about one or two orders of magnitude. Therefore, it is less likely that the storage data in the MTJ memory cell is erroneously rewritten by the sense current Is during the data read operation.

FIG. 27 is a diagram showing the structure of the MTJ memory cell formed on a semiconductor substrate.

Referring to FIG. 27, the access transistor ATR is formed in a p-type region PAR of a semiconductor main substrate SUB. The access transistor ATR has source/drain regions (n-type regions) 110, 120 and a gate 130. The source/drain region 110 is coupled to the ground voltage Vss through a metal wiring formed in a first metal wiring layer M1. A metal wiring formed in a second metal wiring layer M2 is used as the write word line WWL. The bit line BL is formed in a third metal wiring layer M3.

The magnetic tunnel junction MTJ is formed between the second metal wiring layer M2 of the write word line WWL and the third metal wiring layer M3 of the bit line BL. The source/drain region 120 of the access transistor ATR is electrically coupled to the magnetic tunnel junction MTJ through a metal film 150 formed in a contact hole, the first and second metal wiring layers M1 and M2, and a barrier metal 140. The barrier metal 140 is a buffer material for providing electrical coupling between the magnetic tunnel junction MTJ and metal wirings.

As described before, in the MTJ memory cell, the read word line RWL and the write word line WWL are provided independently of each other. The read word line RWL is provided in order to control the gate voltage of the access transistor ATR, and therefore a current need not be actively applied to the read word line RWL. Accordingly, for the purpose of improving the integration degree, the read word line RWL is formed from a polysilicon layer, polycide structure, or the like in the same wiring layer as that of the gate 130. In other words, an additional independent metal wiring layer is not formed for the read word line RWL.

In the data write operation, a data write current for generating a magnetic field having a magnitude equal to or larger than a predetermined value must be applied to the write word line WLL and the bit line BL. Therefore, a relatively large current must be applied to the bit line BL and the write word line WWL, and thus the bit line BL and the write word line WWL are each formed from a metal wiring.

The above-mentioned technical documents disclose the technology of forming an MRAM device, a random access memory (RAM), with such MTJ memory cells integrated on a semiconductor substrate.

FIG. 28 is a memory block diagram illustrating supply of the data write current to the MTJ memory cells arranged in rows and columns in an integrated manner.

Referring to FIG. 28, the MTJ memory cells are generally arranged in rows and columns in order to realize a highly integrated MRAM device. In FIG. 28, the MTJ memory cells are arranged in n rows by m columns (where n, m is a natural number).

As described before, the bit line BL, write word line WWL and read word line RWL are provided for each MTJ memory cell. Accordingly, n write word lines WWL1 to WWLn, n read word lines RWL1 to RWLn, and m bit lines BL1 to BLm are provided for the n×m MTJ memory cells.

In the data write operation, the data write current is applied to the write word line WWL of the selected memory cell row and the bit line BL of the selected memory cell column. For example, in order to write the data to the memory cell MC of the first row, first column, a data write current Ip is applied to the write word line WWL1 activated by a not-shown word line driver, as well as a data write current Iw is applied to the bit line BL1. It should be noted that the direction of the data write currents Ip and Iw must be controlled according to the write data level.

Accordingly, data write circuits 510 and 520 respectively set the voltages at both ends of the bit line of the selected memory cell column to different voltage levels, e.g., the power supply voltage Vcc and the ground voltage Vss. Which voltage is applied to which end of the bit line must be set according to the write data level. Thus, a magnetic field corresponding to the write data level can be applied to the selected memory cell.

A system LSI (Large Scale Integration) such as a logic-mounted memory has been developed which integrates a logic such as processor or ASIC (Application Specific Integrated Circuit) and a mass-storage random access memory (RAM) on the same semiconductor chip (semiconductor substrate).

Such a system LSI interconnects the logic with the memory such as RAM through a multi-bit internal data bus. The internal data bus is short enough as compared to a wiring on the board, and has small parasitic impedance. Therefore, significant reduction in a charging/discharging current of the internal data bus as well as high-speed signal transmission can be realized. For example, the data transfer speed that is at least one order or two orders higher than that of a general-purpose RAM can be realized. Moreover, the number of external pin terminals of the logic can be reduced as compared to the case where a general-purpose memory is externally connected to the logic.

For these reasons, the system LSI such as a logic-mounted memory significantly contributes to improved performance of the information equipments for the processing handling a massive amount of data such as three-dimensional graphic processing and image/speech processing. In a memory mounted in such a system LSI, multi-bit data must be written in parallel.

As described before, in the data write operation of the MRAM device, a data write magnetic field larger than a predetermined value must be applied, and therefore a relatively large write current is required. Accordingly, applying the MRAM device to the logic-mounted system LSI would significantly increase the current consumption since the multi-bit data is written in parallel. This may increase the power consumption and prevent an operational margin from being ensured due to the magnetic noise generated from a power supply wiring.

SUMMARY OF THE INVENTION

It is an object of the present invention to provide a thin film magnetic memory device that writes the data of a plurality of bits in parallel with a small data write current.

According to the present invention, a thin film magnetic memory device capable of writing input data of a plurality of bits in parallel includes a memory array and a plurality of write word lines. The memory array includes a plurality of magnetic memory cells arranged in rows and columns. Each of the plurality of magnetic memory cells includes a storage portion having an electric resistance value varying according to a data level that is written according to combination of first and second data write magnetic fields respectively applied by first and second data write currents. The memory array is divided into a plurality of memory blocks, and one of the plurality of memory blocks is selected in a data write operation. Each of the plurality of memory blocks includes k first bit lines respectively corresponding to the columns of the plurality of magnetic memory cells, for passing the first data write current therethrough (where k is an integer at least 2), a block selection gate for coupling first and second nodes to first and second voltages, respectively, when a corresponding one of the plurality of memory blocks is selected, and a first bit-line current switching portion for connecting the k first bit lines in series between the first and second nodes in the data write operation so that the first data write current flows through each of the k first bit lines in a direction corresponding to a respective data level of k-bit input data. The plurality of write word lines respectively correspond to the rows of the magnetic memory cells, and are selectively activated in the data write operation according to a row selection result, for passing the second data write current therethrough.

Accordingly, a primary advantage of the present invention is that the k-bit input data can be written in parallel by supplying the first data write current to the series-connected k first bit lines in the memory block selected for the data write operation (where k is an integer equal to or larger than 2). As a result, the data write current required to write a plurality of bits in parallel can be suppressed, allowing for reduced power consumption of the MRAM device as well as stabilized operation thereof due to reduced magnetic noise.

According to another aspect of the present invention, a thin film magnetic memory device capable of writing input data of a plurality of bits in parallel includes a memory array, a plurality of first bit lines, a plurality of write word lines, and a bit-line current switching portion.

The memory array includes a plurality of magnetic memory cells arranged in rows and columns. Each of the plurality of magnetic memory cells includes a storage portion having a resistance value varying according to a data level that is written according to combination of first and second data write magnetic fields respectively applied by first and second data write currents. The plurality of first bit lines respectively correspond to the columns of the plurality of magnetic memory cells, for passing the first data write current therethrough according to a column selection result. Each of the first bit lines is divided into h first sub bit lines. The plurality of write word lines respectively correspond to the rows of the magnetic memory cells, and are selectively activated in a data write operation according to a row selection result, for passing the second data write current therethrough. The plurality of write word lines is divided into h groups respectively corresponding to the h first sub bit lines, and one of the write word lines is activated in each of the h groups according to the row selection result. The bit-line current switching portion is provided for every first bit line. Each of the bit-line current switching portions couples the corresponding h first sub bit lines in series between a first node receiving the first data write current to be supplied to a corresponding one of the plurality of first bit lines and a second node receiving the first data write current from the corresponding first bit line, and the coupling of the h first sub bit lines in series between the first and second nodes is conducted so that the first data write current flows through each of the h first sub bit lines of the corresponding first bit line in a direction corresponding to a respective data level of h-bit input data to be written through the corresponding first bit line.

Accordingly, h-bit input data can be written in parallel by supplying the first data write current to the series-connected h first sub bit lines (where h is an integer equal to or larger than 2). As a result, the data write current required to write a plurality of bits in parallel can be suppressed, allowing for reduced power consumption of the MRAM device as well as stabilized operation thereof due to reduced magnetic noise.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
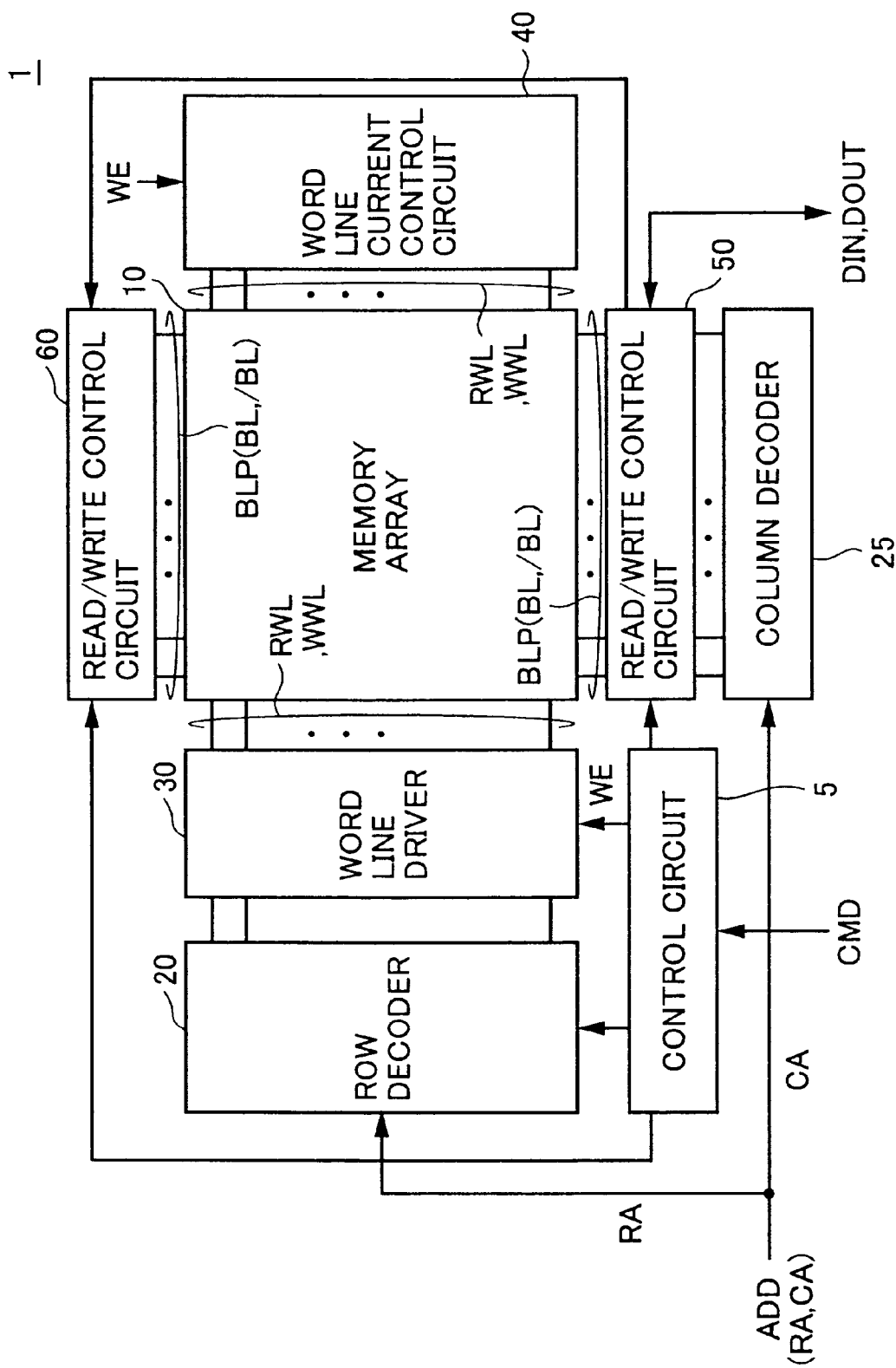
FIG. 1 is a schematic block diagram showing the overall structure of an MRAM device 1, a thin film magnetic memory device, according to a first embodiment of the present invention.

Hereinafter, embodiments of the present invention will be described in detail with reference to the accompanying drawings. The same reference numeral and character denote the same or corresponding portion throughout the figures.

First Embodiment

Referring to FIG. 1, an MRAM device 1, a thin film magnetic memory device according to the first embodiment of the present invention, conducts random access in response to an external control signal CMD and address signal ADD so as to write the input data DIN and read the output data DOUT.

The MRAM device 1 includes a control circuit 5 for controlling the overall operation of the MRAM device 1 in response to the control signal CMD, and a memory array 10 having a plurality of MTJ memory cells arranged in rows and columns. Although the structure of the memory array 10 will be described later in detail, a plurality of write word lines WWL and a plurality of read word lines RWL are provided corresponding to the respective MTJ memory cell rows. A plurality of bit line pairs BLP are provided corresponding to the respective MTJ memory cell columns. Each bit line pair BLP includes complementary bit lines BL and /BL.

The MRAM device 1 further includes a row decoder 20 for selecting a row of the memory array 10 according to a row address RA indicated by the address signal ADD, a column decoder 25 for selecting a column of the memory array 10 according to a column address CA indicated by the address signal ADD, a word line driver 30 for selectively activating a read word line RWL and a write word line WWL based on the row selection result of the row decoder 20, a word line current control circuit 40 for supplying a data write current to the write word line WWL in the data write operation, and read/write control circuits 50, 60 for supplying a data write current and a sense current in the data read and write operations, respectively.

The read/write control circuits 50, 60 control a voltage applied to the bit lines BL, /BL so as to supply a data write current for the data write operation and a sense current for the data read operation to the bit lines BL, /BL.

Figure 2:
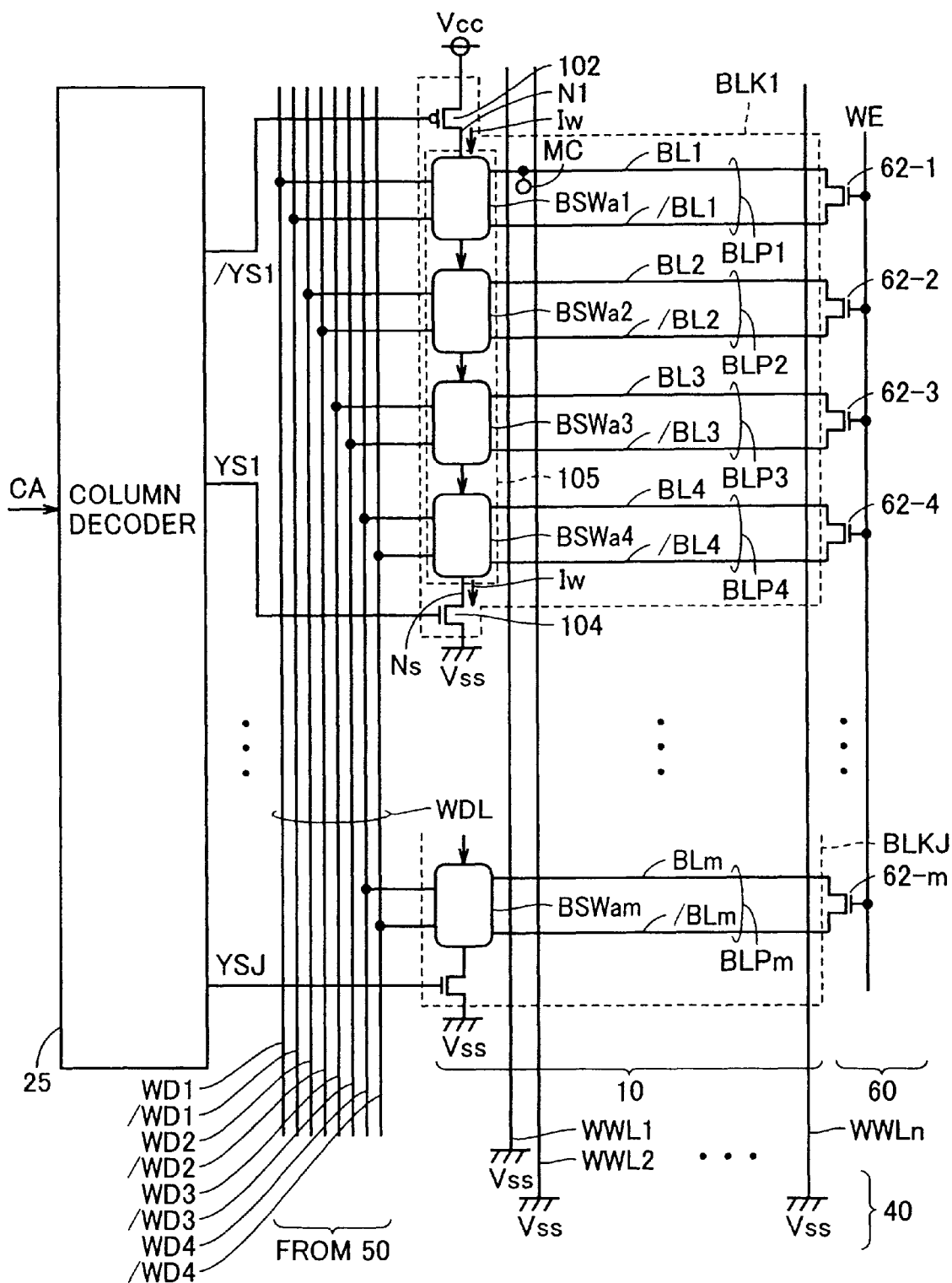
FIG. 2 is a diagram illustrating the structure of a portion associated with a data write operation within a memory array and its peripheral circuitry according to the first embodiment.
Figure 23:
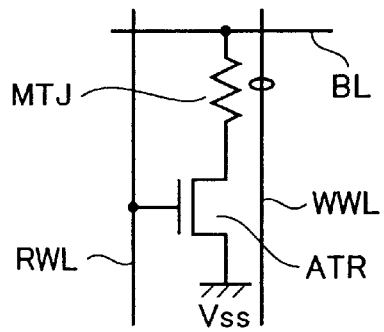
FIG. 23 is a schematic diagram showing the structure of a magnetic memory cell having a magnetic tunnel junction.
Figure 24:
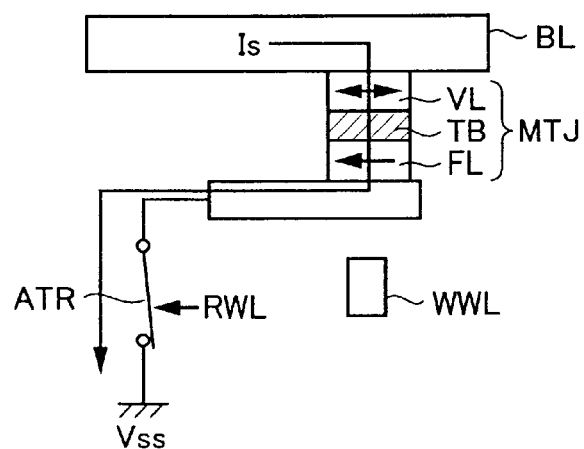
FIG. 24 is a conceptual diagram illustrating the data read operation from the magnetic memory cell of FIG. 23.
Figure 25:
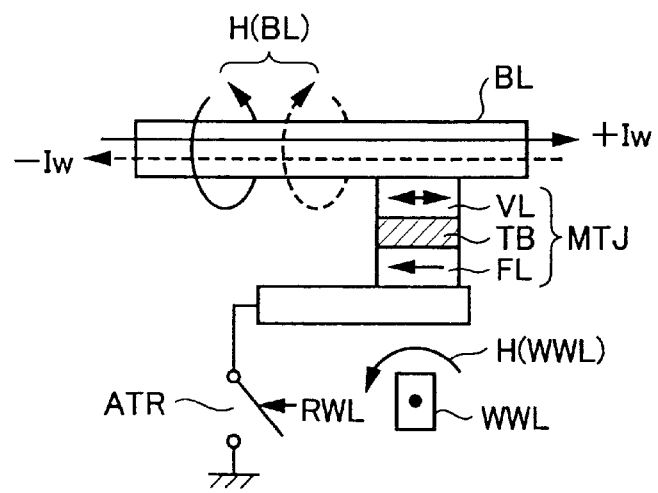
FIG. 25 is a conceptual diagram illustrating the data write operation to the magnetic memory cell of FIG. 23.
Figure 26:
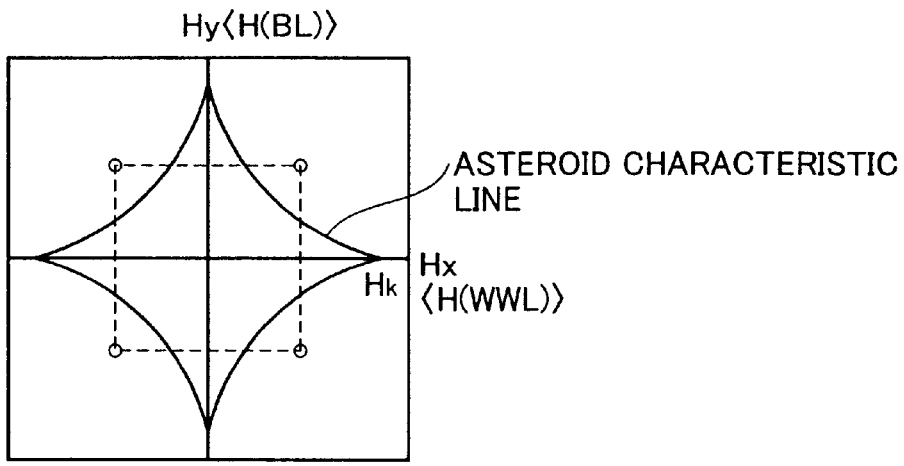
FIG. 26 is a conceptual diagram illustrating the relation between the direction of a data write current and the direction of a magnetic field in the data write operation.
Figure 27:
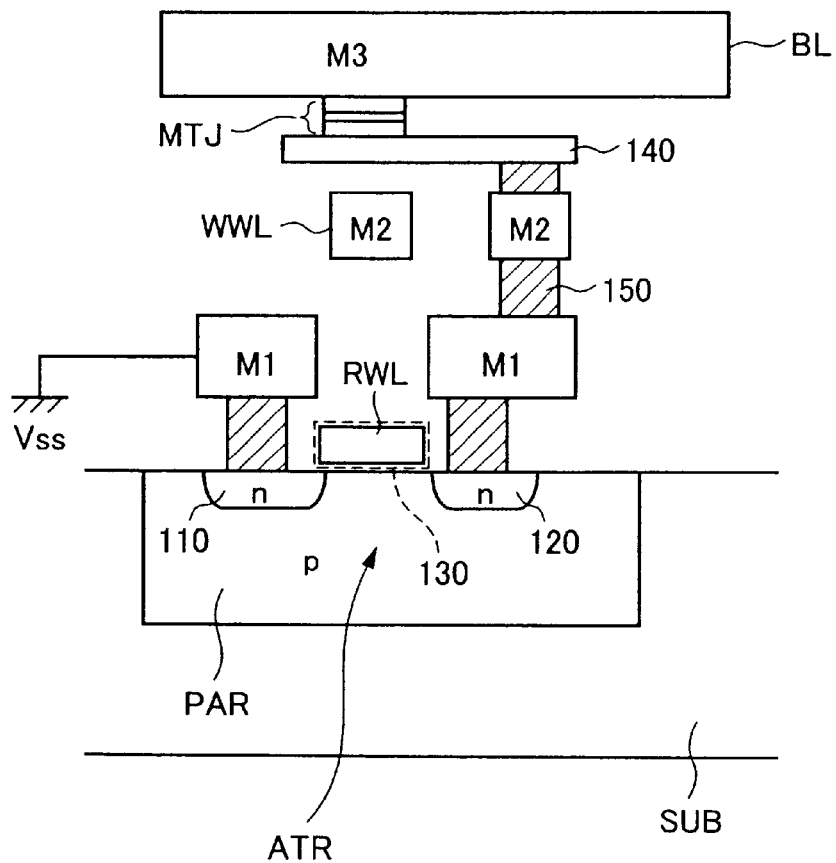
FIG. 27 is a structural diagram of a magnetic memory cell formed on a semiconductor substrate.
Figure 28:
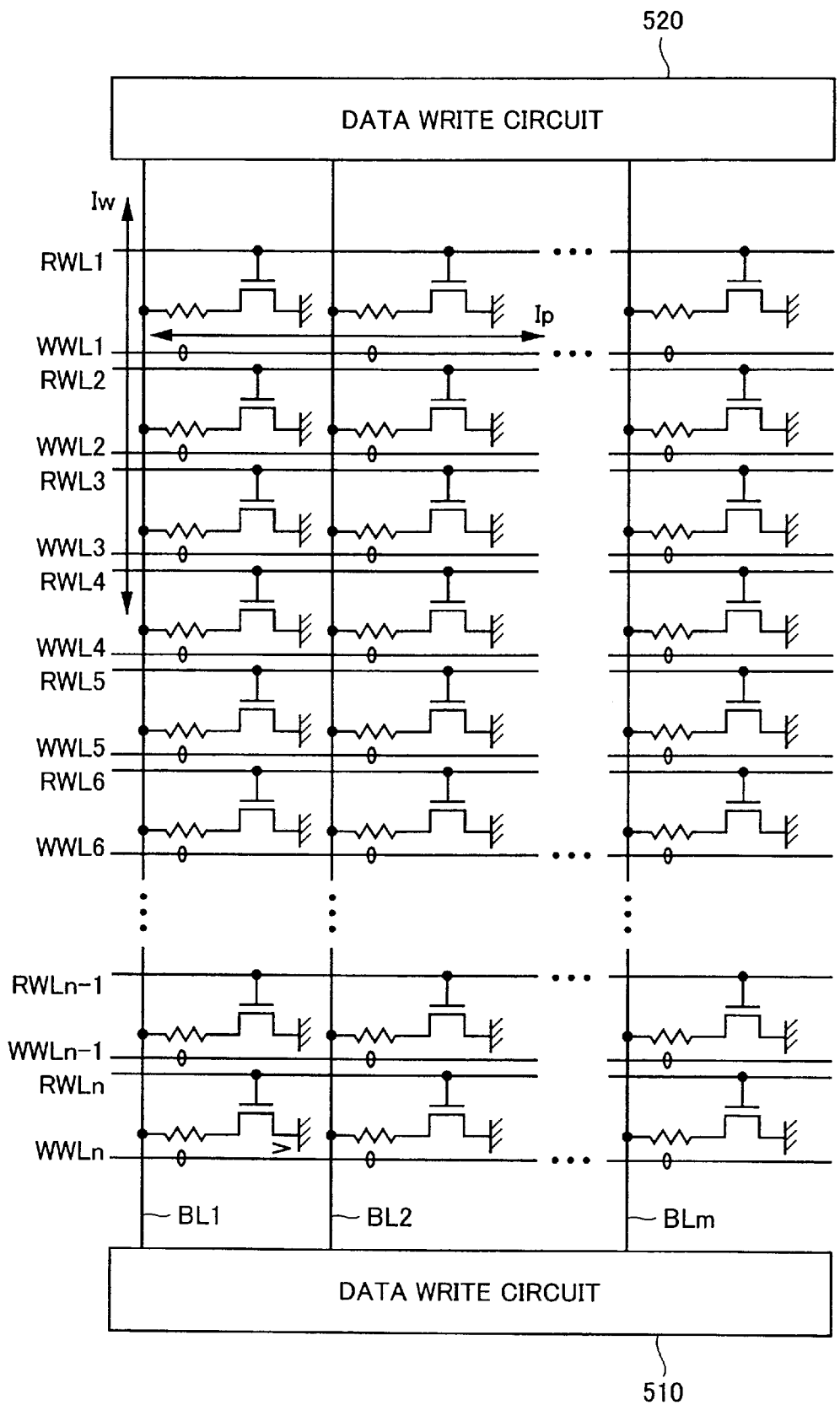
FIG. 28 is a block diagram illustrating the operation of supplying a data write current to the magnetic memory cells arranged in rows and columns in an integrated manner.

Referring to FIG. 2, the memory array 10 has memory cells arranged in n rows by m columns (where n, m is a natural number). Each memory cell has the same structure as that shown in FIG. 23.

Write word lines WWL1 to WWLn are provided corresponding to the respective memory cell rows. Although not shown in the figure, read word lines RWL1 to RWLn for row selection in the data read operation are also provided corresponding to the respective memory cell rows.

Bit line pairs BLP1 to BLPm are provided corresponding to the respective memory cell columns. Each bit line pair is formed from two complementary bit lines. For example, the bit line pair BLP1 is formed from bit lines BL1 and /BL1.

Note that, hereinafter, the write word lines, read word lines and bit line pairs are also generally denoted with WWW, RWL and BLP, respectively. A specific write word line, read word line and bit line pair are denoted with, for example, WWL1, RWL1 and BLP1, respectively. Moreover, one of the complementary bit lines of each bit line pair BLP1 to BLPm, i.e., BL1 to BLm, is also generally denoted with BL, and the other of the complementary bit lines of each bit line pair BLP1 to BLPm, i.e., /BL1 to /BLm, is also generally denoted with /BL.

FIG. 2 exemplarily shows a memory cell MC of the first row, first column. The memory cell MC shown in FIG. 2 is coupled to the read line RWL1 not shown and one bit line BL1 of the bit line pair BLP1.

The word line current control circuit 40 couples the write word lines WWL1 to WWLn to the ground voltage Vss. Thus, a data write current can be supplied to the write word line WWL activated to the selected state (high-voltage state: H level).

Hereinafter, the data write and read operations to and from the MTJ memory cell will be described with reference to FIG. 3.

Figure 3:
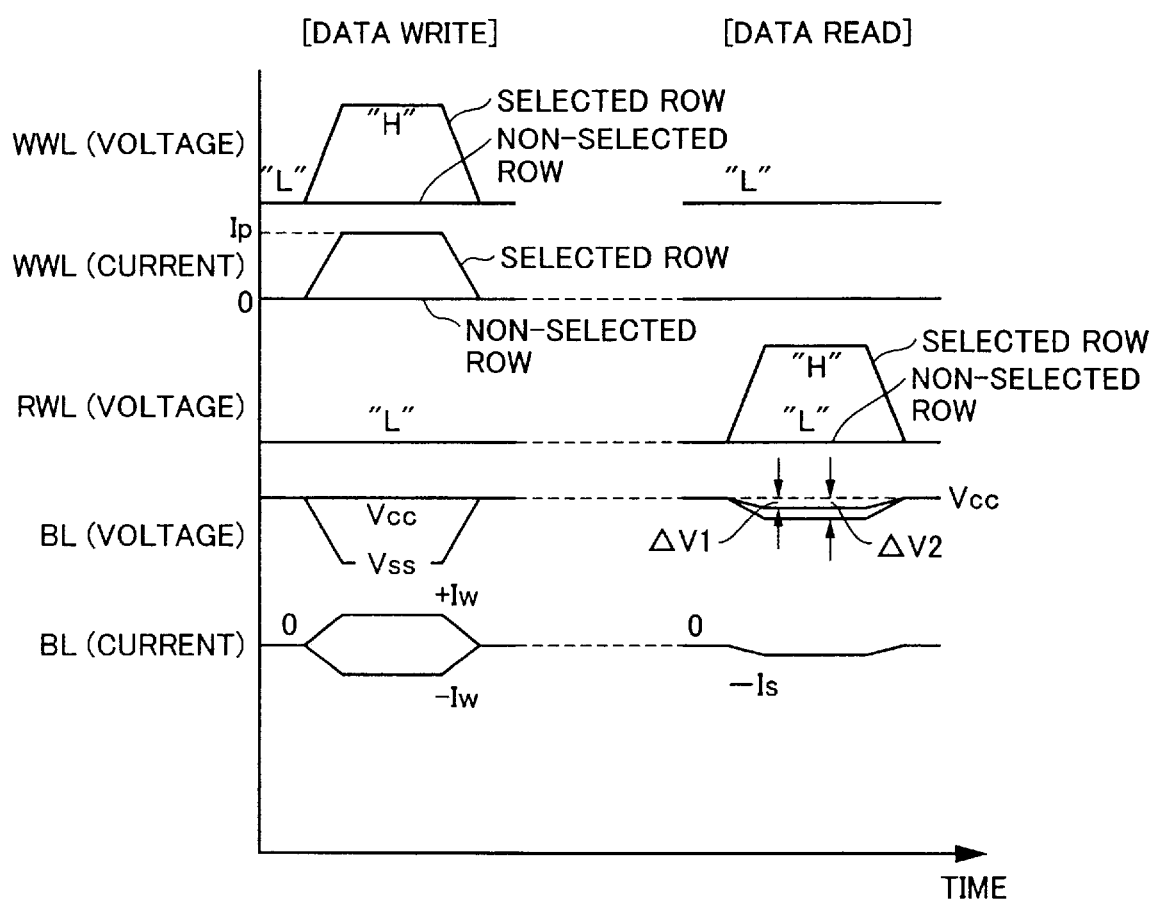
FIG. 3 is a timing chart illustrating the data write and read operations to and from a magnetic memory cell.

Note that it is assumed in the description of FIG. 3 that the magnetic memory cell is coupled to the bit line BL.

First, the data write operation will be described. According to the row selection result of the row decoder 20, the word line driver 30 drives the voltage on the write word line WWL of the selected row to the selected state (H level). In the non-selected rows, the voltage levels on the write word lines WWL are retained in the non-selected state (L level: ground voltage Vss). Accordingly, a data write current Ip flows through the write word line WWL of the selected row.

The data write current flowing through the bit line BL is set in the direction corresponding to the input data level by controlling the voltage on the bit line BL. For example, in order to write the storage data "1", a data write current +Iw is applied to the bit line BL. In order to write the storage data "0", a data write current −Iw is applied to the bit line BL. The direction of the data write current ±Iw can be controlled by appropriately setting the respective voltages at both ends of the bit line BL.

Figure 4:
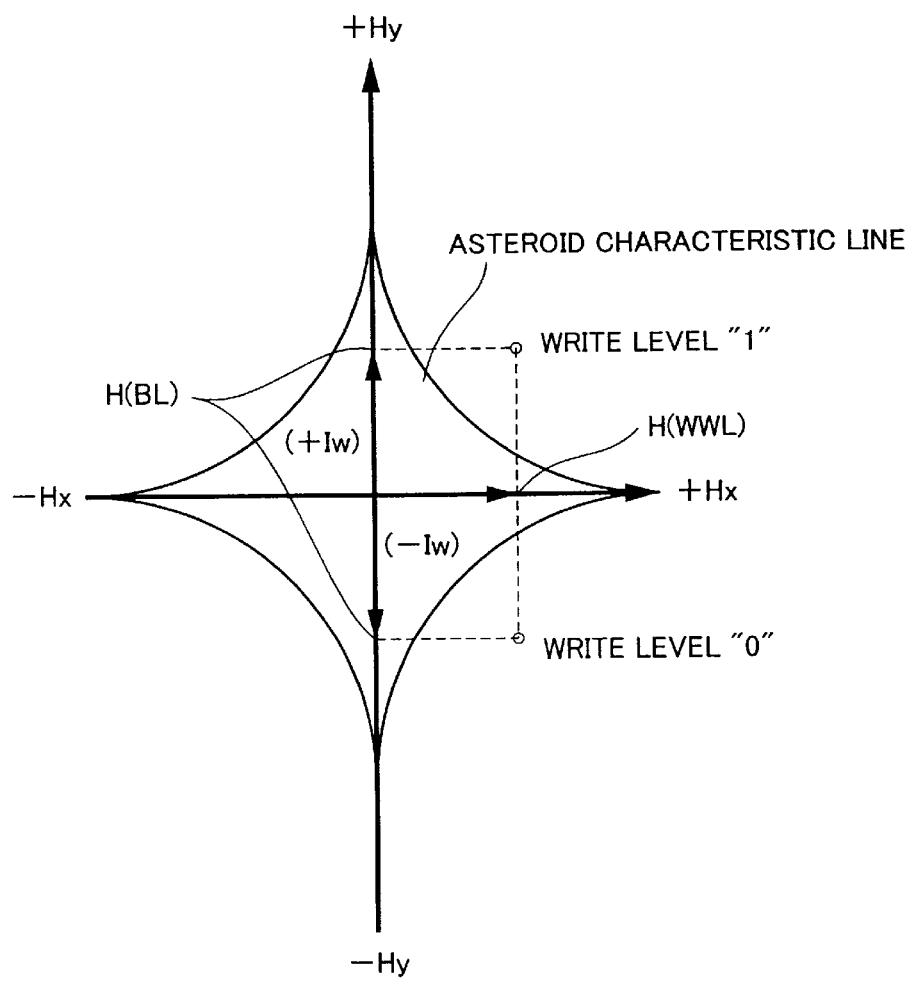
FIG. 4 is a conceptual diagram illustrating the respective directions of a data write current and a magnetic field produced at an MTJ memory cell in the data write operation.

Referring to FIG. 4, in the data write operation, the data write current Ip for producing the magnetic field H(WWL) in the direction +Hx is applied to the write word line WWL. The data write current +Iw or −Iw for producing the magnetic field H(BL) in the direction +Hy or −Hy depending on the write data level is applied to the bit line BL.

Thus, a magnetic field corresponding to the region outside the asteroid characteristic line is generated by combination of the magnetic fields H(WWL) and H(BL), so that the magnetic field direction corresponding to the data level can be written to the free magnetic layer VL of the MTJ memory cell.

One of the data write currents +Iw and −Iw of the opposite directions is selectively produced according to the input data level "1", "0", and the direction of the data write current Ip on the write word line WWL is fixed regardless of the data level. Thus, the data write operation can be conducted.

As a result, the structure of the word line current control circuit 40 can be simplified, i.e., the word line current control circuit 40 need only sink the write word lines WWL1 to WWLn to the ground voltage Vss. Although not shown in detail in the figure, the voltage on the write word line of the selected row can be set to a fixed value regardless of the input data level. Therefore, the structure of the word line driver 30 can also be simplified.

Next, the data read operation will be described.

Referring back to FIG. 3, in the data read operation as well, the word line driver 30 drives the read word line RWL of the selected row to the selected state (H level) according to the row selection result of the row decoder 20. The voltage level on the read word lines RWL of the non-selected rows is retained in the non-selected state (L level: ground voltage Vss).

Before the data read operation, the bit lines BL are precharged to, e.g., a high voltage state (power supply voltage Vcc). In response to activation of the read word line RWL of the selected row to H level, a corresponding access transistor ATR is turned ON. Accordingly, in the MTJ memory cell, a current path of the sense current Is is formed from the bit line BL to the ground voltage Vss through the access transistor ATR.

The read/write control circuit 50 supplies a constant sense current Is to the bit line BL in the data read operation. The sense current Is is generally smaller than the bit line current ±Iw of the data write operation by about two orders of magnitude. For example, the data write currents +Iw and −Iw of the data write operation are on the order of 10 mA, whereas the sense current Is is on the order of 0.1 mA.

Such a sense current Is causes a change in voltage on the bit line BL. This voltage change varies according to the storage data level of the MTJ memory cell. For example, it is now assumed in FIG. 3 that the fixed magnetic layer FL and the free magnetic layer VL have the same magnetic field direction when the storage data level is "1". In this case, the bit line BL has a small voltage change ΔV1 when the storage data is "1", and has a voltage change ΔV2 larger than ΔV1 when the storage data is "0". The data of the MTJ memory cell can be read at a high speed by sensing the difference between the voltage changes ΔV1 and ΔV2.

Referring back to FIG. 2, the memory array 10 is divided into a plurality of memory blocks. Each memory block includes k bit line pairs (where k is an integer in the range of 2 to m/2). Accordingly, the entire memory array 10 has J memory blocks BLK1 to BLKJ (where J is a natural number given by m/k).

The write word lines WWL1 to WWLn are provided in common in the memory blocks BLK1 to BLKJ. Accordingly, by selecting a single write word line and a single memory block, k-bit data can be written in parallel to the selected memory block.

Description will now be given for the case of k=4. In other words, 4-bit data is written in parallel in a single write operation of the MRAM device 1. It should be noted that the present invention is not limited to such an application, but is widely applicable to MRAM devices for writing a plurality of bits (k bits) in parallel in a single data write operation.

Near the memory array 10 are provided bit-line coupling transistors 62-1 to 62-m corresponding to the respective bit line pairs BLP, i.e., the respective memory cell columns. Hereinafter, the bit-line coupling transistors 62-1 to 62-m are also generally referred to as bit-line coupling transistors 62.

In the embodiment of the present invention, at least the bit-line coupling transistors 62 corresponding to a memory block selected for the data write operation must be turned ON to electrically couple the bit lines BL and /BL of the respective bit line pairs BLP to each other. In the structure of FIG. 2, the bit-line coupling transistors 62 are turned ON and OFF in response to a control signal WE that is activated in the data write operation. Accordingly, in the data write operation, each of the bit-line coupling transistors 62-1 to 62-m are turned ON to electrically couple the bit lines BL and /BL of the. respective bit line pairs BLP to each other.

In the data write operation, the column decoder 25 selectively activates one of memory block selection signals YS1 to YSJ corresponding to the respective memory blocks BLK1 to BLKJ to H level, according to the decode result of the column address CA, i.e., the column selection result. Inverted signals of the memory block selection signals YS1 to YSJ are denoted with /YSL to /YSJ.

Adjacent to the memory array 10 are provided write data transmission lines WDL for transmitting 4-bit input data (k=4) to be written in parallel in a single write operation. The write data transmission lines WDL respectively transmit input data bits WD1 to WD4 indicating the respective bit levels of the input data DIN and inverted bits /WD1 to /WD4 thereof.

The structure for writing the 4-bit data k=4) in parallel in each memory block will now be described. Since each memory block has the same structure, the structure of the first memory block BLK1 will be exemplarily described in connection with FIG. 2.

The memory block BLK1 includes memory block selection gates 102 and 104.

The memory block selection gate 102 is electrically coupled between a node N1 for receiving a data write current Iw for use in writing the data in the memory block BLK1 and the power supply voltage Vcc, and is turned ON in response to the memory block selection signal YS1. The memory block selection gate 102 electrically couples the node N1 to the power supply voltage Vcc when the corresponding memory block BLK1 is selected.

The memory block selection gate 104 is electrically coupled between a node Ns for outputting the data write current Iw used for writing the data in the memory block BLK1 and the ground voltage Vss, and is turned ON or OFF in response to the memory block selection signal YS1. The memory block selection gate 104 electrically couples the node Ns to the ground voltage Vss when the corresponding memory block BLK1 is selected.

The memory block selection gate 102 is formed from a P-channel field effect transistor (FET) receiving at its gate the memory block selection signal /YSL that is activated to L level upon selection of the corresponding memory block BLK1. Similarly, the memory block selection gate 104 is formed from an N-channel FET receiving at its gate the memory block selection signal YS1 that is activated to H level upon selection of the corresponding memory block BLK1.

The memory block BLK1 further includes a bit-line current switching portion 105 for connecting the bit line pairs BLP1 to BLP4 in series between the nodes N1 and Ns so that the respective directions of the data write current flowing through the bit line pairs BLP1 to BLP4 correspond to the respective levels of the input data bits WD1 to WD4. The bit-line current switching portion 105 includes bit-line current switch units BSWa1 to BSWa4. In the entire memory array 10, the bit-line current switch units BSWa1 to BSWam having the same structure and function are provided respectively corresponding to the bit line pairs BLP1 to BLPm.

The function of the bit-line current switch unit will now be described with reference to FIG. 5.

Figure 5:
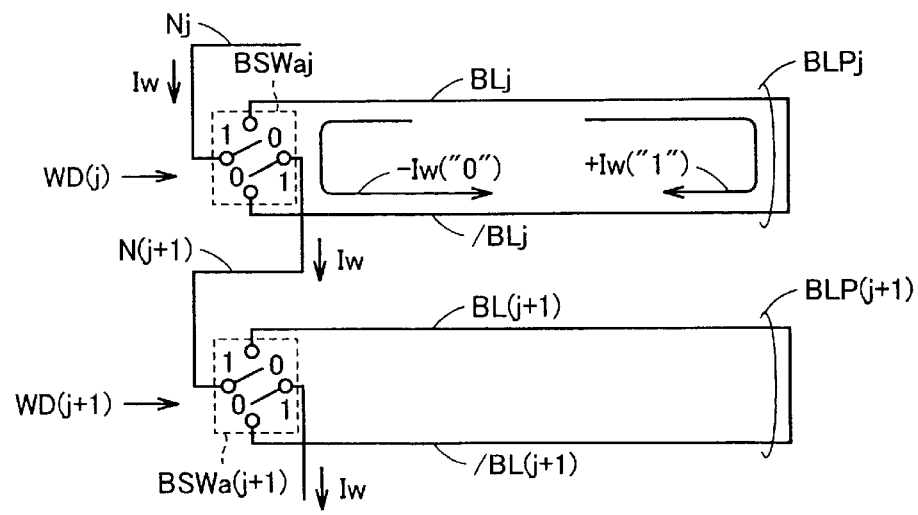
FIG. 5 is a conceptual diagram illustrating the function of a bit-line current switch unit of FIG. 2.

FIG. 5 shows bit-line current switch units BSWaj and BSWa(j+1) respectively corresponding to the $j^{th}$ and $(j+1)^{th}$ memory cell columns (where j is a natural number in the range of 1 to m−1). The input data bits written through the bit line pairs BLPj and BLP(j+1) are respectively denoted with WD(j) and WD(j+1).

The bit-line current switch unit BSWaj supplies the data write current Iw transmitted to the node Nj to the bit line pair BLPj as a reciprocating current +Iw or −Iw having the direction corresponding to the level of the input data bit WD(j).

When the level of the input data bit WD(j) is "1", the bit-line current switch unit BSWaj electrically couples the node Nj to the bit line BLj as well as electrically couples the bit line /BLj to the node N(j+1). As described before, the bit lines BLj and /BLj are electrically coupled through the bit-line coupling transistor 62. Accordingly, a path of the reciprocating current +Iw is formed in the bit line pair BLPj.

When the level of the input data bit WD(j) is "0", the bit-line current switch unit BSWaj electrically couples the node Nj to the bit line /BLj as well as electrically couples the bit line BLj to the node N(j+1). Accordingly, a path of the reciprocating current −Iw is formed in the bit line pair BLPj.

The data write current Iw is transmitted from the bit-line current switch unit BSWaj to the node N(j+1) in the fixed direction regardless of the level of the input data bit WD(j).

Similarly, the bit-line current switch unit BSWa(j+1) supplies the data write current Iw transmitted to the node N(j+1) to the bit line pair BLP(j+1) as a reciprocating current +Iw or −Iw having the direction corresponding to the level of the input data bit WD(j+1).

With such a structure, the respective reciprocating current paths formed in the bit line pairs BLPj and BLP(j+1) are connected in series with each other. As a result, the direction of the reciprocating current path in each bit line pair can be set according to the corresponding input data bit, as well as the common data write current Iw can be supplied to the bit line pairs BLPj and BLP(j+1).

Referring back to FIG. 2, arrangement of the bit-line current switch units in the memory block BLK1 will be described.

The bit-line current switch unit BSWa1 supplies the data write current Iw supplied to the node N1 through the memory block selection gate 102 to the bit lines BL1 and /BL1 as a reciprocating current +Iw or −Iw having the direction corresponding to the level of the first input data bit WD1. The bit-line current switch unit BSWa1 also transmits the data write current Iw of the fixed direction to the bit-line current switch unit BSWa2 corresponding to the following bit line pair BLP2.

The bit-line current switch unit BSWa2 supplies the data write current Iw transmitted from the bit-line current switch unit BSWa1 to the bit lines BL2 and /BL2 as a reciprocating current +Iw or −Iw having the direction corresponding to the level of the second input data bit WD2. The bit-line current switch unit BSWa2 also transmits the data write current Iw of the fixed direction to the bit-line current switch unit BSWa3 corresponding to the following bit line pair BLP3.

The bit-line current switch unit BSWa3 supplies the data write current Iw transmitted from the bit-line current switch unit BSWa2 to the bit lines BL3 and /BL3 as a reciprocating current +Iw or −Iw having the direction corresponding to the level of the third input data bit WD3. The bit-line current switch unit BSWa3 also transmits the data write current Iw of the fixed direction to the bit-line current switch unit BSWa4 corresponding to the following bit line pair BLP4.

The bit-line current switch unit BSWa4 supplies the data write current Iw transmitted from the bit-line current switch unit BSWa3 to the bit lines BL4 and /BL4 as a reciprocating current +Iw or −Iw having the direction corresponding to the level of the fourth input data bit WD4. The node Ns receiving the data write current Iw of the fixed direction from the bit-line current switch unit BSWa4 is electrically coupled to the ground voltage Vss through the memory block selection gate 104.

Thus, in the memory block selected for the write operation, the bit line pairs BLP1 to BLP4 can be connected in series between the power supply voltage Vcc and the ground voltage Vss in response to turning-ON of the memory block selection gates 102 and 104 so that the directions of the reciprocating current paths in the bit line pairs BLP1 to BLP4 of the memory block correspond to the respective data levels of the input data bits WD1 to WD4. As a result, 4-bit data can be written in parallel within the same memory block with a single data write current Iw.

Figure 6:
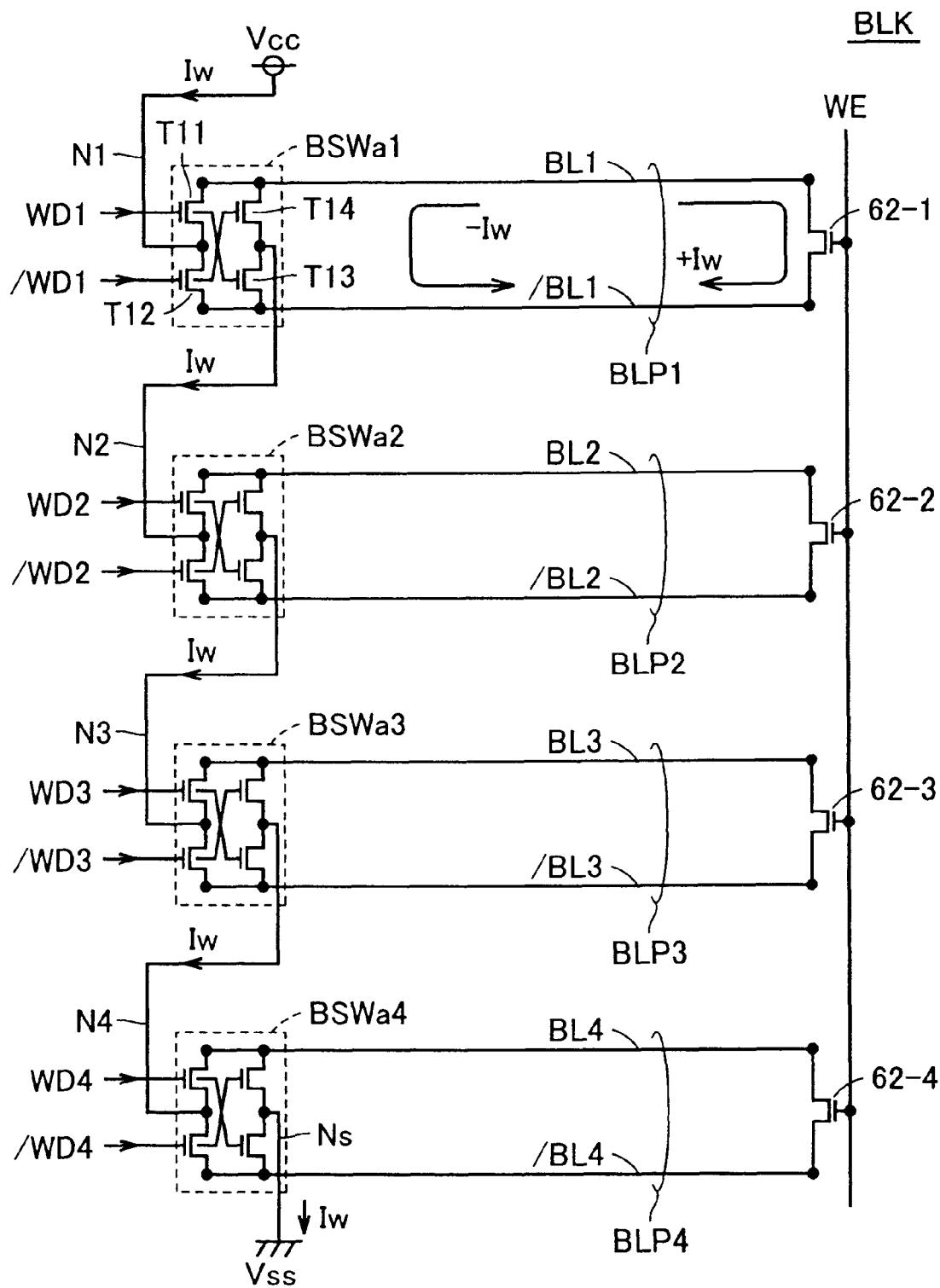
FIG. 6 is a circuit diagram showing an example of the structure of the bit-line current switch unit of FIG. 2.

FIG. 6 shows the structure of the bit-line current switch units BSWa1 to BSWa4 included in the memory block BLK1. Since each bit-line current switch unit has the same structure, the structure of the bit-line current switch unit BSWa1 will be exemplarily described in connection with FIG. 6.

The bit-line current switch unit BSWa1 includes transistor switches T11 to T14. The transistor switch T11 is electrically coupled between the node N1 coupled to the power supply voltage Vcc through the memory block selection gate 102 and the bit line BL1. The transistor switch T12 is electrically coupled between the node N1 and the bit line /BL1. The transistor switch T13 is electrically coupled between the bit line /BL1 and the node N2. The transistor switch T14 is electrically coupled between the node N2 and the bit line BL1.

The input data bit WD1 is applied to the gates of the transistor switches T11 and T13. The inverted bit /WD1 of the input data bit WD1 is applied to the gates of the transistor switches T12 and T14.

Accordingly, when the input data bit WD1 is "1", the transistor switches T11 and T13 are turned ON as well as the transistor switches T12 and T14 are turned OFF. As a result, the data write current Iw transmitted to the node N1 flows through a current path formed from the node N1, transistor switch T11, bit line BL1, bit-line coupling transistor 62-1, bit line /BL1, transistor switch T13 and node N2. Thus, a reciprocating current +Iw flows through the bit line pair BLP1.

When the input data bit WD1 is "0", the transistor switches T12 and T14 are turned ON as well as the transistor switches T11 and T13 are turned OFF. As a result, the data write current Iw transmitted to the node N1 flows through a current path formed from the node N1, transistor switch T12, bit line /BL1, bit-line coupling transistor 62-1, bit line BL1, transistor switch T14 and node N2. Thus, a reciprocating current −Iw flows through the bit line BLP1.

The data write current Iw flows into the nodes N1 and N2 in the same direction regardless of the level of the input data bit WD1.

Since the bit-line current switch units BSWa2 to BSWa4 have the same structure as that of the bit-line current switch unit BSWa1, detailed description thereof will not be repeated.

Figure 7:
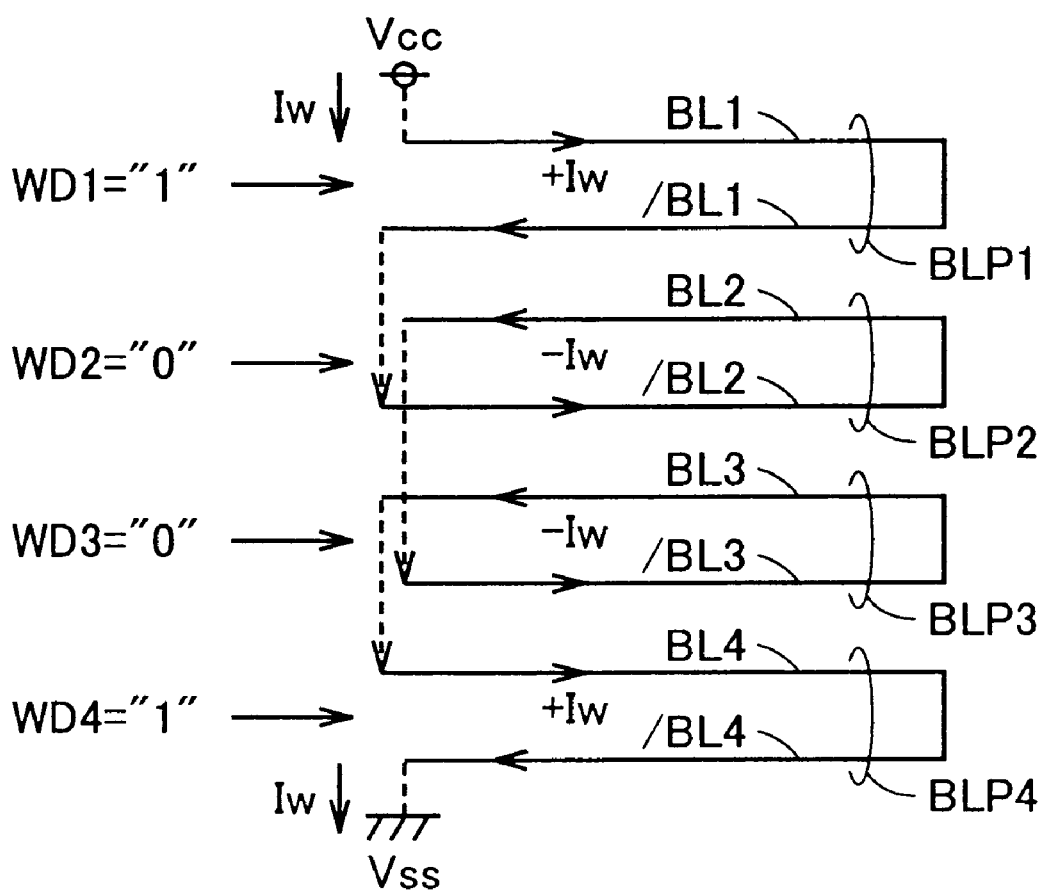
FIG. 7 is a conceptual diagram showing an example of writing the data of a plurality of bits in parallel in a selected memory block.

FIG. 7 shows an example of the operation of writing a plurality of bits in parallel to a selected memory block.

Referring to FIG. 7, the input data bits WD1, WD2, WD3 and WD4 of the 4-bit input data (k=4) are respectively set to the level "1", "0", "0" and "1".

The bit-line current switch units BSW1a to BSWa4 set the direction of the reciprocating current in the respective bit line pairs BLP1 to BLP4 according to the level of the corresponding input data bit. In other words, the data write current flows through the bit line pairs BLP1, BLP2, BLP3 and BLP4 in the directions of +Iw, −Iw, −Iw and +Iw, respectively.

In response to selective activation of one of the word lines WWL1 to WWLn of FIG. 2, data write magnetic fields corresponding to the input data bits WD1 to WD4 are respectively applied to four memory cells (k=4) corresponding to the selected write word line WWL, whereby the data is written thereto.

Thus, in order to write k-bit data in parallel, the data write current is supplied through k bit lines (or bit line pairs) coupled in series between the power supply voltage Vcc and the ground voltage Vss. With such a structure, current consumption of the data write operation can be reduced. More specifically, the overall current consumption can be reduced to 1/k of that in the case of supplying the data write current independently to each of the k bit lines (or bit line pairs) selected for the parallel write operation. As a result, the magnetic noise resulting from the data write current can be reduced, achieving further stabilized operation of the MRAM device.

The memory-cell arrangement of the memory array 10 will now be described.

Figure 8:
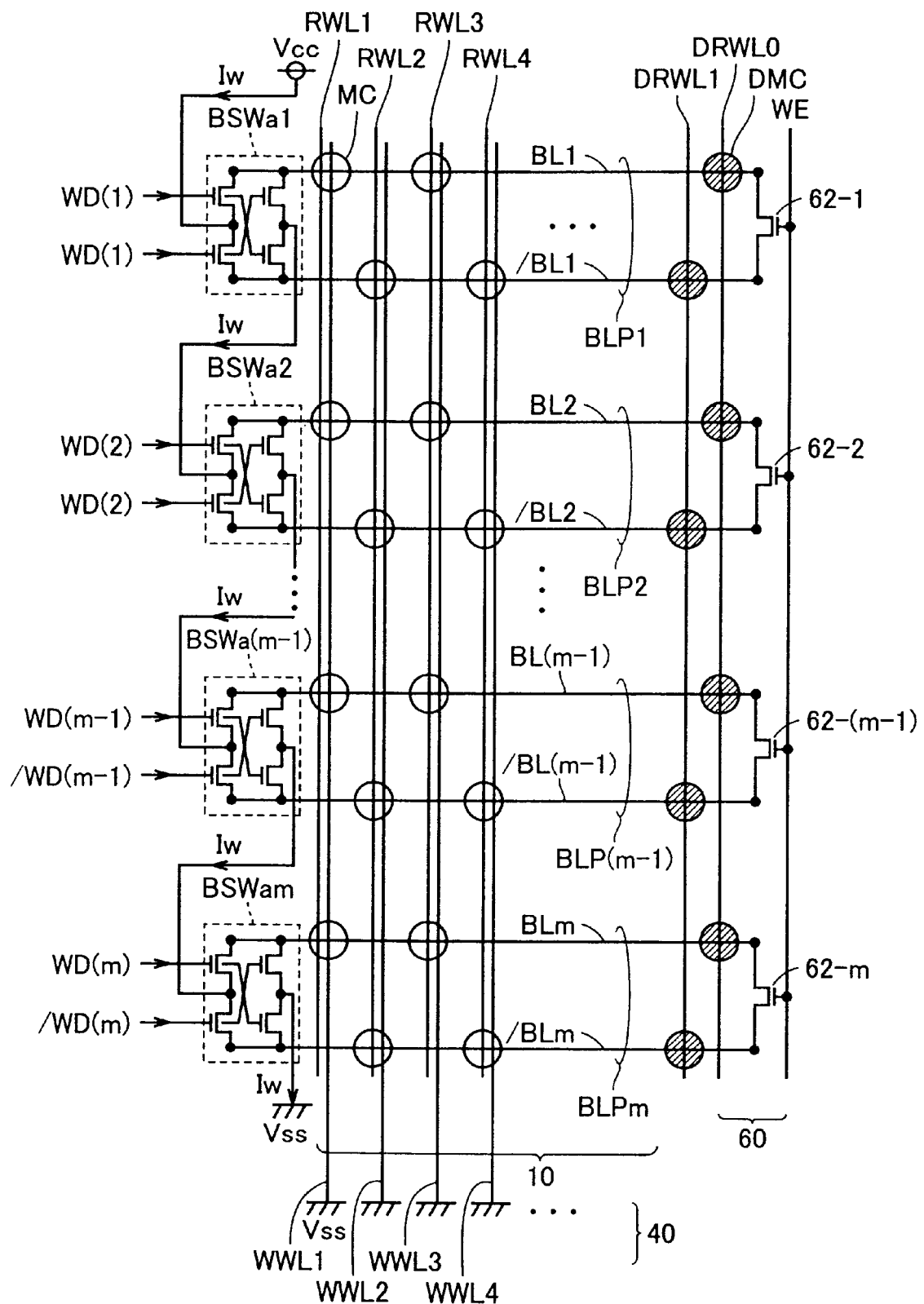
FIG. 8 is a conceptual diagram showing a first example of the memory cell arrangement in a memory array.

Referring to FIG. 8, m bit line pairs BLP1 to BLPm are provided in the entire memory array 10. The memory cells MC are alternately coupled to the bit lines BL1 to BLm or the bit lines /BL1 to /IBLm in every other row. For example, the memory cell group corresponding to the first memory cell row, i.e., the write word line WWL1 and the read word line RWL1, is coupled to the bit lines BL1 to BLm. The memory cells MC of the second memory cell row are respectively coupled to the bit lines /BL1 to /BLm.

By alternately coupling the memory cells MC to the bit lines BL or /BL of the bit line pairs in every other row, the data can be read and written based on the folded bit-line pair structure.

More specifically, when the read word line RWL is selectively activated according to the row selection result, either the bit lines BL1 to BLm or the bit lines /BL1 to /BLm are respectively coupled to the corresponding memory cells MC.

The memory array 10 further includes a plurality of dummy memory cells DMC respectively corresponding to the bit lines BL1, /BL1 to BLm, /BLm. The dummy memory cells DMC are selected by either a dummy read word line DRWL0 or DRWL1. The dummy memory cell group selected by the dummy read word line DRWL0 is electrically coupled to the bit lines BL1 to BLm, respectively. The dummy memory cell group selected by the dummy read word line DRWL1 is electrically coupled to the bit lines /BL1 to /BLm, respectively.

The dummy read word line DRWL0, DRWL1 is selectively activated such that the bit lines that are not connected to the memory cells MC of the selected memory cell row (i.e., the bit lines BL to BLm or the bit lines /BL1 to /BLm) are respectively coupled to the dummy memory cells DMC.

As a result, the bit lines BL1 to BLm and the bit lines /BL1 to /BLm are respectively coupled to m memory cells MC of the selected memory cell row and m dummy memory cells DMC.

As described before, the electric resistance value of the memory cell MC varies according to the storage data level. Assuming that the memory cell MC storing the data of level "1" has a resistance value Rl and the memory cell MC storing the data of level "0" has a resistance value Rh, a resistance value Rd of the dummy memory cell DMC is set to an intermediate value of Rl and Rh.

Thus, the storage data level of the selected memory cell can be read by comparison between a voltage change on one bit line coupled to the dummy memory cell DMC and a voltage change on the other bit line coupled to the selected memory cell.

In the data read operation, each bit-line coupling transistor 62 is turned OFF in response to inactivation of the control signal WE. Therefore, the bit lines BL and /BL of each bit line pair BLP are electrically disconnected from each other in the data read operation.

Accordingly, the sense current (data read current) Is as described in connection with FIG. 3 is applied to each of the bit lines BL and /BL of the selected memory cell column so as to detect the difference in a voltage change between the bit lines BL and /BL resulting from the sense current Is. Thus, the data can be read with a sufficient read margin.

Figure 9:
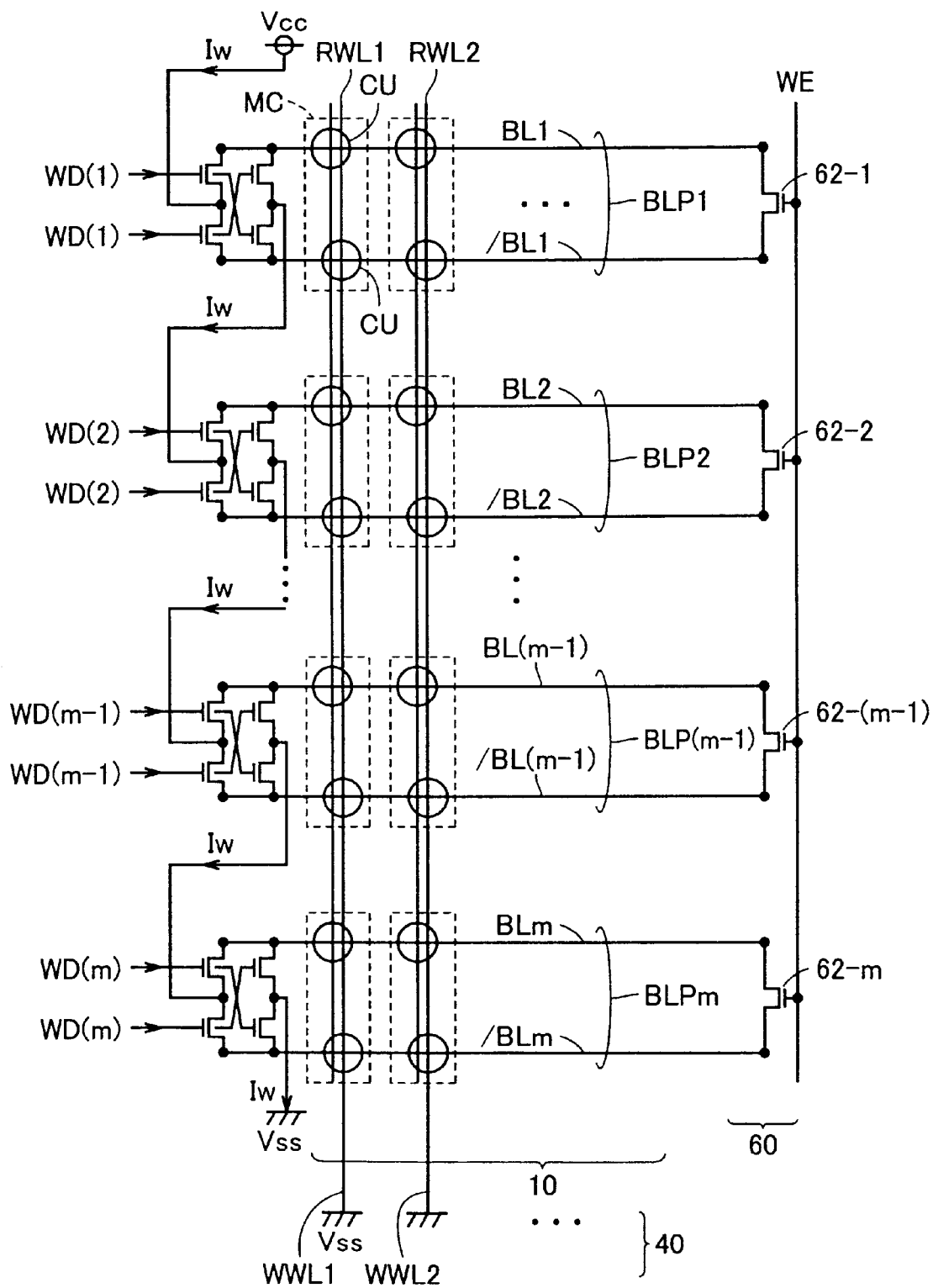
FIG. 9 is a conceptual diagram showing a second example of the memory cell arrangement in a memory array.

Referring to FIG. 9, in each memory cell row, a cell unit CU is provided at each intersection with the bit lines BL and /BL. Each cell unit CU has the same structure as that of the MTJ memory cell shown in FIG. 23. Two cell units CU respectively coupled to the bit lines BL and /BL of the same bit line pair form a single memory cell MC for one-bit data storage. In other words, complementary levels are written to the two cell units CU of the same memory cell.

Thus, the memory cell MC has a twin-cell structure (two-transistor cell structure). In the structure of the first embodiment, a bit line pair is formed in each memory cell column for the data read and write operations. Therefore, such twin-cell-type memory cells may be used.

In the twin-cell-type memory cell, the data can be read and written by the completely complementary operations, achieving a stabilized operation of the MRAM device.

Alternatively, a memory cell using a diode as an access element may be applied as an MTJ memory cell suitable for improved integration.

Figure 10:
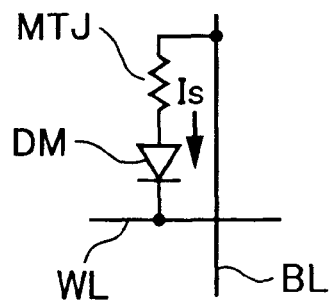
FIG. 10 is a schematic diagram showing a first example of the structure of an MTJ memory cell using a diode.

Referring to FIG. 10, an MTJ memory cell MCDD using a diode includes a magnetic tunnel junction MTJ and an access diode DM. The access diode DM is coupled between the magnetic tunnel junction MTJ and the word line WL. The forward direction thereof is the direction from the magnetic tunnel junction MTJ toward the word line WL. The bit line BL extends in such a direction that crosses the word line WL, and is coupled to the magnetic tunnel junction MTJ.

A data write current is applied to the word line WL and the bit line BL in order to write the data to the MTJ memory cell MCDD. The direction of the data write current is set according to the write data level, as in the case of the memory cell using an access transistor.

In the data read operation, the word line WL corresponding to the selected memory cell is set to a low voltage (e.g., ground voltage Vss) state. At this time, the bit line BL has been precharged to a high voltage (e.g., power supply voltage Vcc) state so that the access diode DM is rendered conductive by forward biasing. Accordingly, the sense current Is can be supplied to the magnetic tunnel junction MTJ.

The word lines WL corresponding to the non-selected memory cells are set to the high voltage state. Therefore, the corresponding access diodes DM are reverse-biased and thus retained non-conductive. As a result, the sense current Is does not flow therethrough.

Thus, the data read and write operations can be conducted also in the MTJ memory cells using an access diode.

Figure 11:
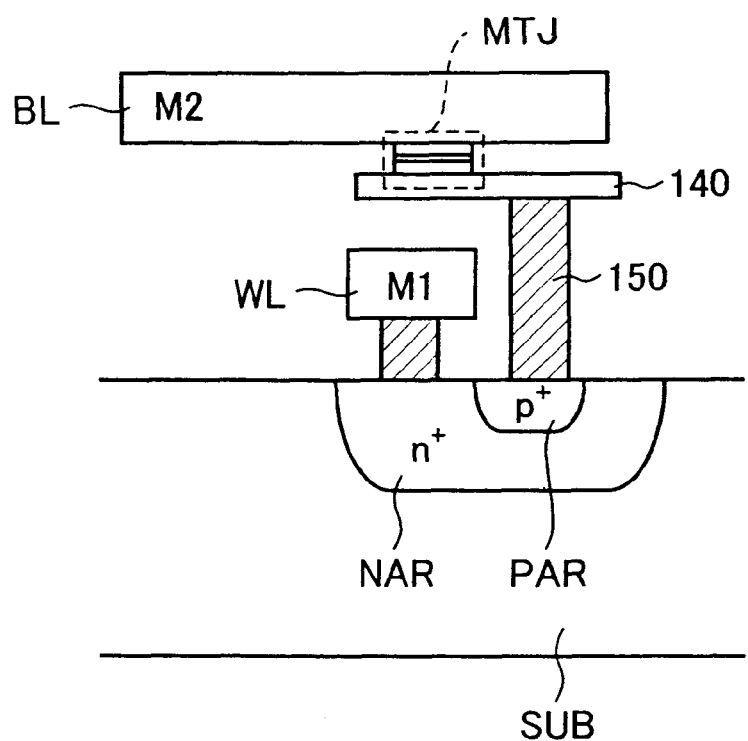
FIG. 11 is a structural diagram showing the MTJ memory cell of the first example being formed on a semiconductor substrate.

Referring to FIG. 11, the access diode DM is formed from an n-type region NAR formed at a semiconductor main substrate SUB and a p-type region PAR formed at the n-type region NAR.

The n-type region NAR corresponding to the cathode of the access diode DM is coupled to the word line WL formed in a metal wiring layer M1. The p-type region PAR corresponding to the anode of the access diode DM is electrically coupled to the magnetic tunnel junction MTJ through a barrier metal 140 and a metal film 150. The bit line BL is formed in a metal wiring layer M2 so as to be coupled to the magnetic tunnel junction MTJ. Thus, the use of the access diode instead of the access transistor results in an MTJ memory cell advantageous in terms of improved integration.

However, the data write current flows through the word line WL and the bit line BL in the data write operation, causing a voltage drop on the word line WL and the bit line BL. Depending on the voltage distribution on the word line WL and the bit line BL, such a voltage drop may possibly turn ON the PN junction of the access diode DM in a non-selected MTJ memory cell(s). This may unexpectedly cause a current to flow thorough the MTJ memory cell, resulting in erroneous data write operation.

Figure 12:
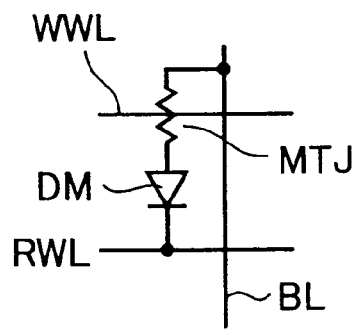
FIG. 12 is a schematic diagram showing a second example of the structure of an MTJ memory cell using a diode.

Referring to FIG. 12, an MTJ memory cell MCD using a diode includes a magnetic tunnel junction MTJ and an access diode DM, as in the case of FIG. 10. The MTJ memory cell MCD of FIG. 12 is different from the MTJ memory cell MCDD of FIG. 10 in that a read word line RWL and a write word line WWL are provided independently. A bit line BL extends in such a direction that crosses the write word line WWL and the read word line RWL, and is electrically coupled to the magnetic tunnel junction MTJ.

The access diode DM is coupled between the magnetic tunnel junction MTJ and the read word line RWL. The forward direction thereof is the direction from the magnetic tunnel junction MTJ toward the read word line RWL. The write word line WWL is provided near the magnetic tunnel junction MTJ without being connected to another wiring.

In the MTJ memory cell MCD, a current need not be supplied to the read word line RWL in the data write operation. Therefore, the voltage on the read word line RWL can be stably retained in a high voltage state (power supply voltage Vcc), whereby the access diode DM can be reliably reverse-biased and retained in the non-conductive state. As a result, the data write operation can be stabilized as compared to the MTJ memory cell MCDD shown in FIG. 10.

Figure 13:
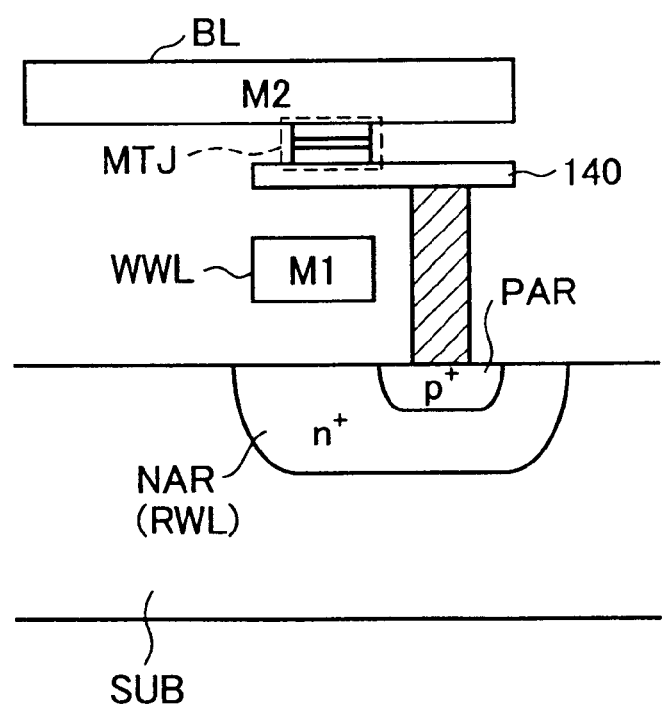
FIG. 13 is a structural diagram showing the MTJ memory cell of the second example being formed on a semiconductor substrate.

Referring to FIG. 13, the MTJ memory cell MCD includes a write word line WWL as an independent wiring. The write word line WWL can be formed in, e.g., a metal wiring layer M1. Note that, since the access diode DM, magnetic tunnel junction MTJ and bit line BL are formed in the same manner as that of FIG. 11, detailed description thereof will not be repeated.

By coupling the n-type regions NAR corresponding to the cathodes of the access diodes DM to each other between the MTJ memory cells MCD of the same row, the connection between the access diode DM and the read word line RWL as shown in FIG. 12 can be implemented without using any additional metal wiring layer for the read word line RWL. Such a structure can realize both improved integration and stabilized operation.

Such MTJ memory cells MCD using a diode may be substituted for the memory cells MC of FIG. 8 and the cell units CU of FIG. 9. In such a case, the memory cells MC and cell units CU using an access transistor in the respective structure of FIGS. 8 and 9 need only be replaced with the memory cells MCD using a diode.

Alternatively, the MTJ memory cells MCDD using a diode may be substituted for the memory cells MC of FIG. 8 and the cell units CU of FIG. 9.

Figure 14:
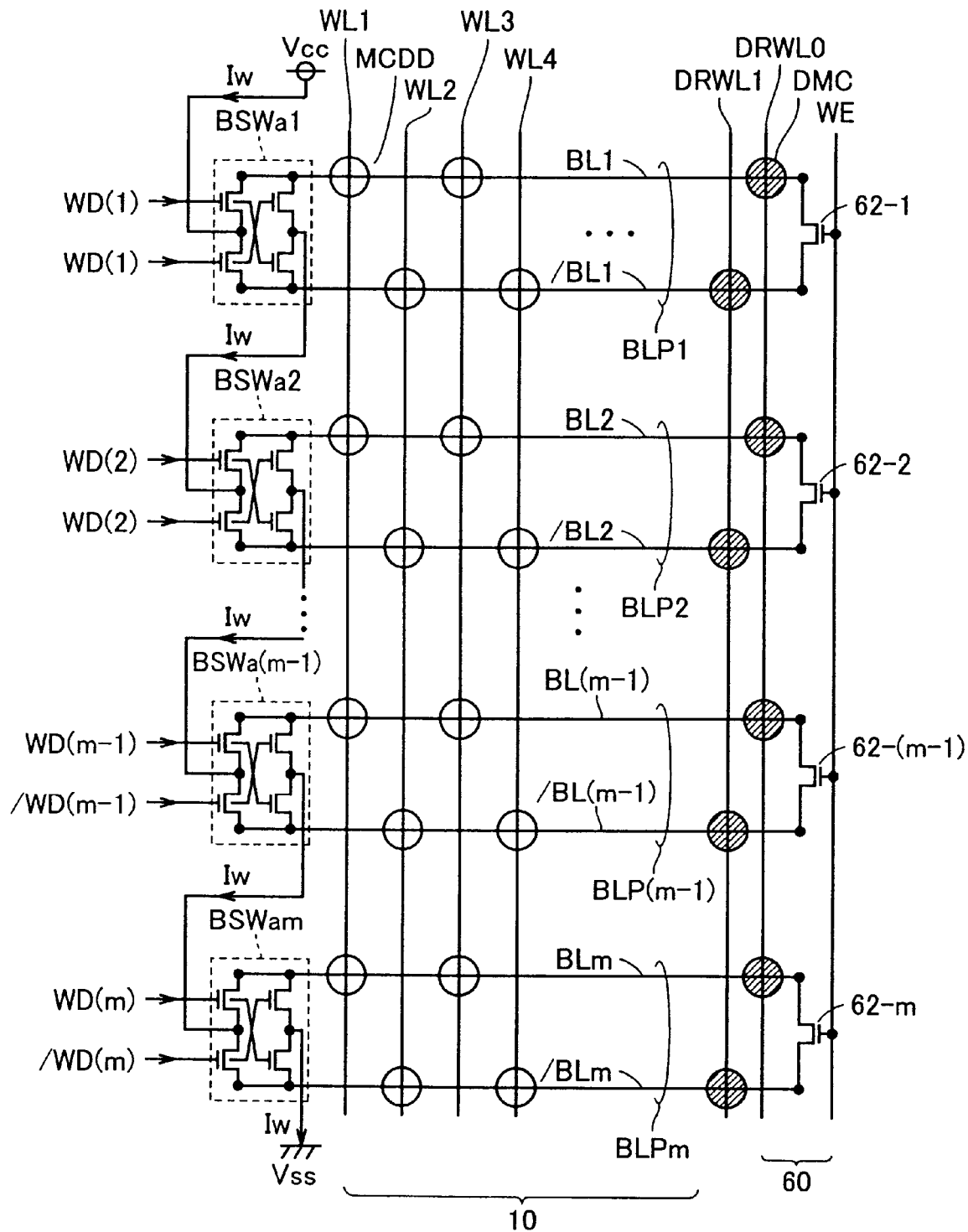
FIG. 14 is a conceptual diagram showing a first example of the arrangement of the MTJ memory cells of FIG. 12 in a memory array.

FIG. 14 shows the structure of FIG. 8 with the memory cells MC using an access transistor replaced with the memory cells MCDD using a diode. In this case, the word lines WL1 to WLn for use in common in the data read and write operations are provided corresponding to the respective memory cell rows. Since the structure of FIG. 14 is otherwise the same as that of FIG. 8, detailed description thereof will not be repeated.

Figure 15:
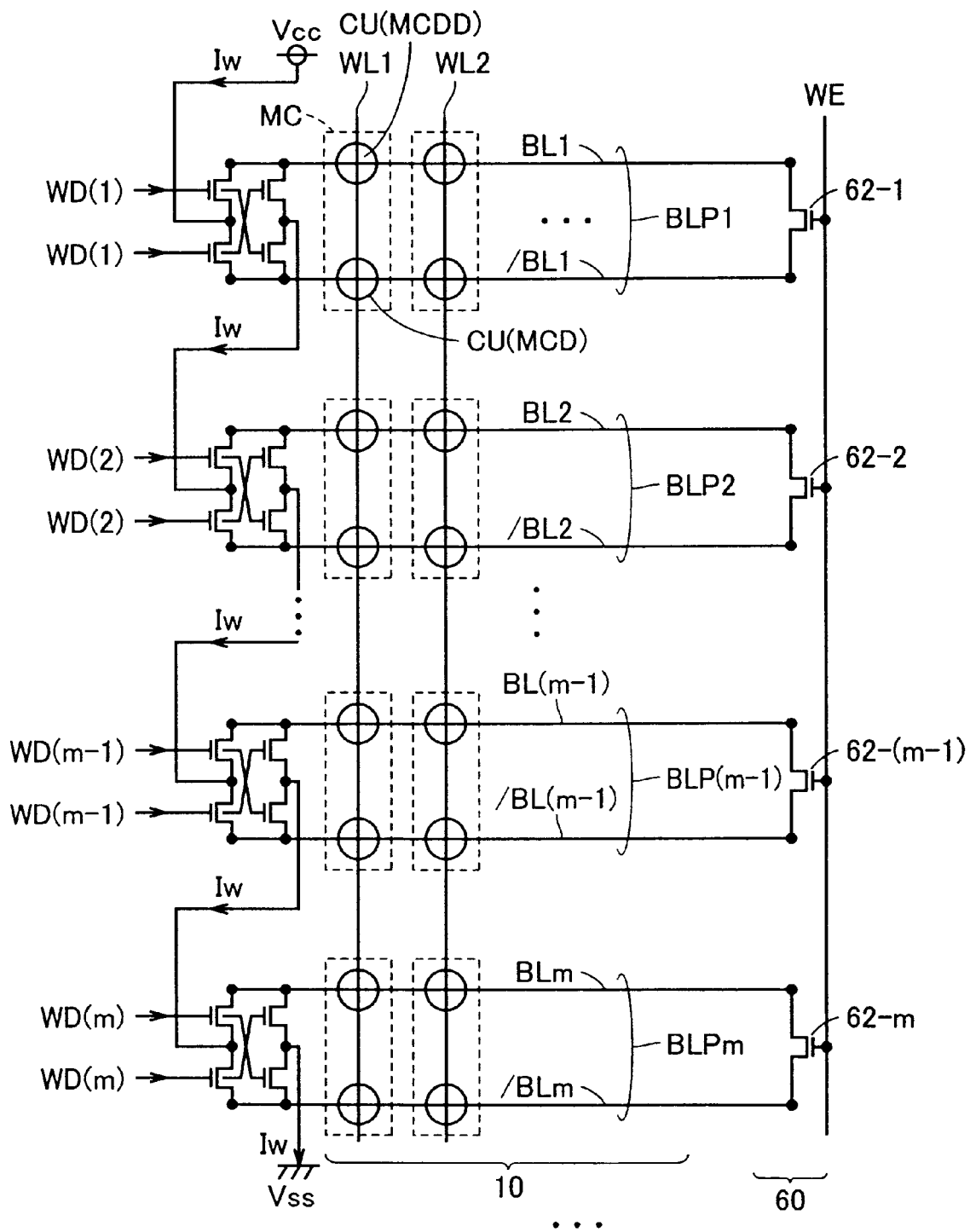
FIG. 15 is a conceptual diagram showing a second example of the arrangement of the MTJ memory cells of FIG. 12 in a memory array.

FIG. 15 shows the structure of FIG. 9 with the cell units CU replaced with the memory cells MCDD using a diode. In this case, the word lines WL1 to WLn for use in common in the data read and write operations are provided corresponding to the respective memory cell rows. Since the structure of FIG. 15 is otherwise the same as that of FIG. 9, detailed description thereof will not be repeated.

The use of the MTJ memory cells using a diode as an access element enables further improved integration of the memory array 10, achieving reduction in size of the MRAM device of the first embodiment.

Second Embodiment

Figure 16:
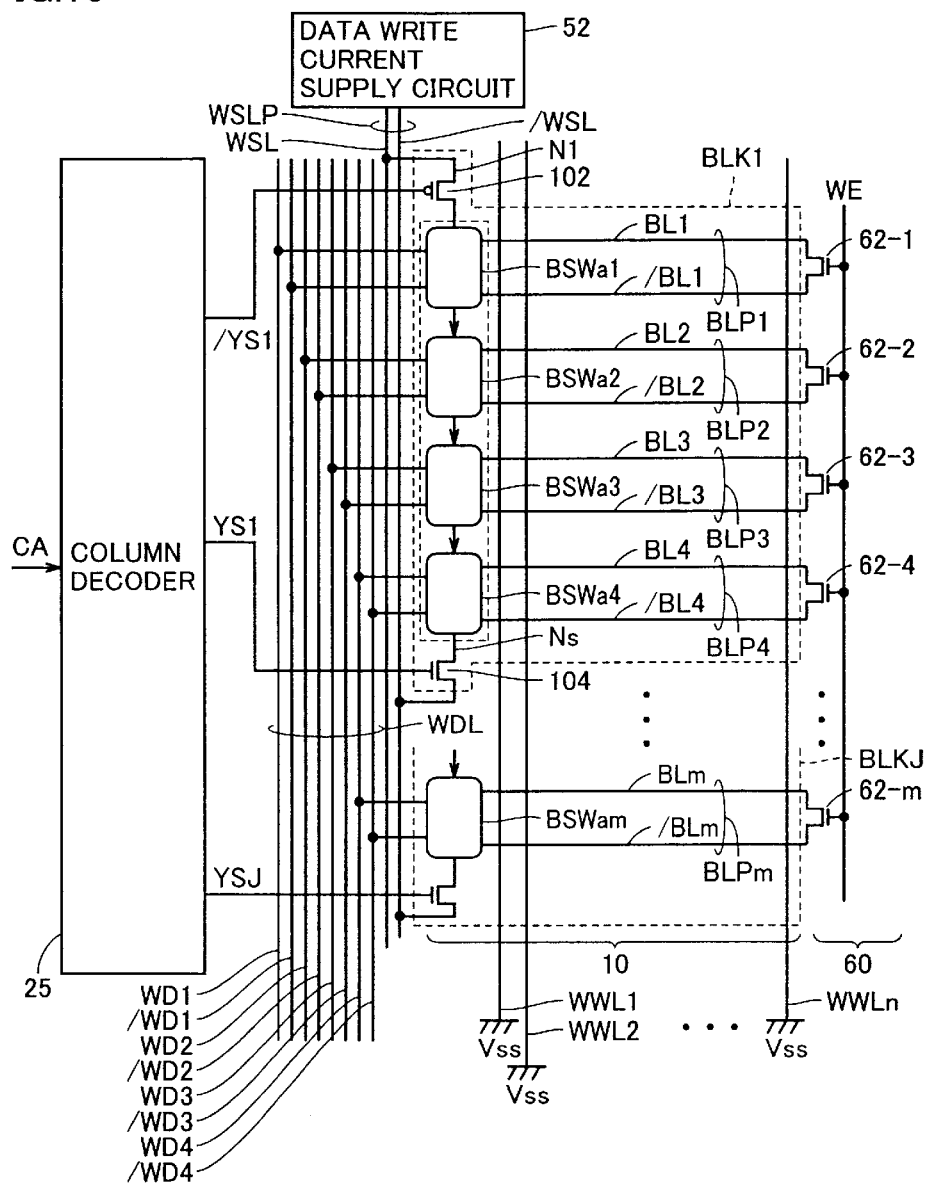
FIG. 16 is a diagram illustrating in detail the structure of a portion associated with a data write operation within a memory array and its peripheral circuitry according to a second embodiment of the present invention.

Referring to FIG. 16, the structure of the second embodiment is different from that of the first embodiment shown in FIG. 2 in that a data write current supply circuit 52 supplies the data write current Iw to each memory block.

The structure of the second embodiment further includes a data write current supply line pair WSLP for supplying the data write current Iw to each memory block. The data write current supply line pair WSLP includes complementary data write current supply lines WSL and /WSL.

The memory block selection gates 102 and 104 of the memory block selected for the data write operation are turned ON. As a result, a path of the data write current Iw is formed from the data write current supply circuit 52, data write current supply line WSL, selected memory block, data write current supply line /WSL, and data write current supply circuit 52.

Since the memory block selection gates 102 and 104 are turned ON only in the memory block selected for the data write operation, the data write current Iw can be supplied only to the bit line pairs included in the selected memory block.

Figure 17:
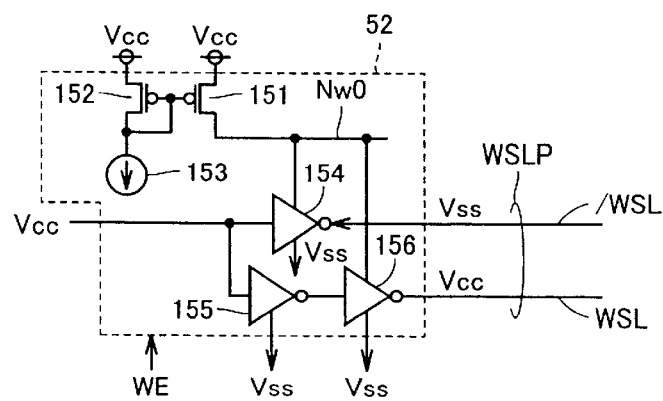
FIG. 17 is a circuit diagram showing the structure of a data write current supply circuit of FIG. 16.

Referring to FIG. 17, the data write current supply circuit 52 includes a P-channel MOS transistor 151 serving as a current source for supplying a constant current to an internal node Nw0, a P-channel MOS transistor 152 forming a current mirror circuit for controlling a current of the transistor 151, and a current source 153.

The data write current supply circuit 52 further includes inverters 154, 155 and 156 operating in response to an operating current supplied from the internal node Nw0. The inverter 154 operates as a voltage driving circuit for receiving the power supply voltage Vcc and driving the voltage level on the data write current supply line /WSL to the ground voltage Vss. The inverter 155 receives the power supply voltage Vcc and outputs the ground voltage Vss. The inverter 156 operates as a voltage driving circuit for receiving the ground voltage Vss from the inverter 155 and driving the voltage on the data write current supply line WSL to the power supply voltage Vcc.

With such a structure, the data write current supply circuit 52 can control the data write current Iw supplied to the data write current supply line pair WSLP to a constant current. As a result, the temperature dependency, dependency on a variation in power supply voltage Vcc, and dependency resulting from process variation, of the data write current Iw can be eliminated, achieving a stable data write operation.

Third Embodiment

The third embodiment of the present invention shows the structure for supplying a data write current Iw by data write current supply lines arranged in a hierarchical manner.

Figure 18:
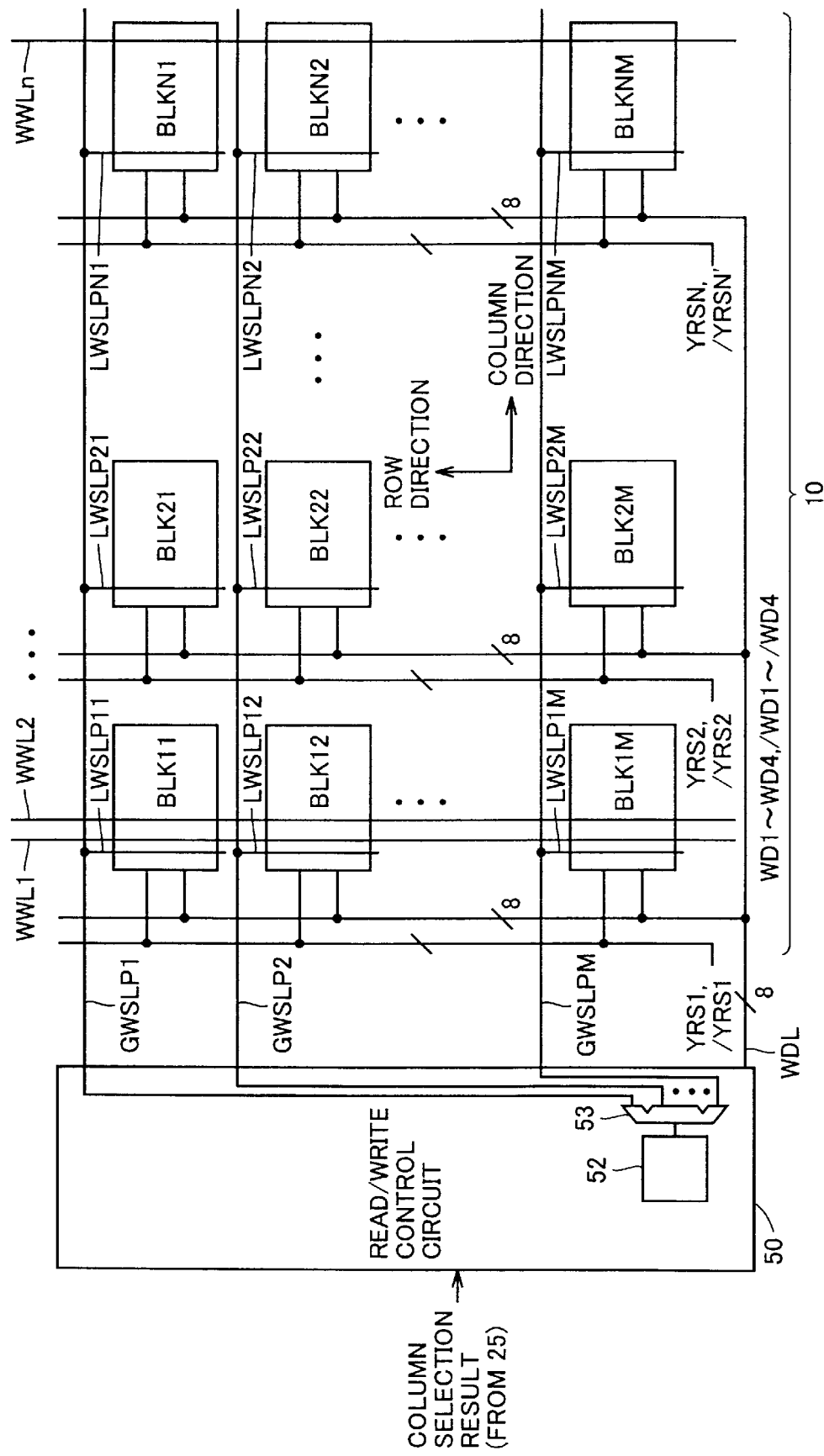
FIG. 18 is a schematic block diagram illustrating the structure of circuitry associated with a data write operation within a memory array and its peripheral circuitry according to a third embodiment of the present invention.

FIG. 18 is a schematic block diagram illustrating the structure of circuitry associated with the data write operation within a memory array and its peripheral circuitry according to the third embodiment.

Referring to FIG. 18, in the structure of the third embodiment, a plurality of memory blocks BLK11 to BLKNM are arranged in N rows by M columns (where N, M is an integer). As in the first embodiment, each of the memory blocks BLK11 to BLKMN has k bit line pairs, so that k-bit data can be written in parallel.

Moreover, n write word lines WWL1 to WWLn are provided in the entire memory array 10. In the data write operation, one of the write word lines WWL1 to WWLn is activated according to the row selection result, and a data write current Ip is applied thereto.

The other data write current Iw for use in the data write operation is supplied through global data write current supply line pairs GWSLP and local data write current supply line pairs LWSLP, which are provided in a hierarchical manner. The global data write current supply line pairs GWSLP are provided respectively corresponding to the columns of the memory blocks, and extend in the column direction. Each global data write current supply line pair GWSLP is shared by a plurality of memory blocks that are adjacent to each other in the column direction. Accordingly, the global data write current supply line pairs GWSLP1 to GWSLPM are provided in the entire memory array 10. For example, the global data write current supply line pair GWSLP1 is shared by the memory blocks BLK11 to BLKN1.

Note that, hereinafter, the rows and columns of the memory blocks are also referred to as memory block rows and memory block columns, respectively. The structure of FIG. 18 includes N memory block rows and M memory block columns.

The local data write current supply line pairs LWSLP are provided respectively corresponding to the memory blocks BLK11 to BLKNM, and extend in the row direction. Therefore, the local data write current supply line pairs LWSLP11 to LWSLPNM are provided in the entire memory array 10. Each local data write current supply line pair LWSLP is coupled to a corresponding global data write current supply line pair GWSLP. For example, the local data write current supply line pairs LWSLP11 to LWSLPN1 corresponding to the same memory block column are coupled to the global data write current supply line pair GWSLP1.

In the data write operation, the read/write control circuit 50 including the data write current supply circuit 52 of FIG. 17 and a selector 53 selectively supplies the data write current Iw to a single global data write current supply line pair GWSLP according to the column selection result. The read/write control circuit 50 transmits input data bits WD1 to WD4 of 4-bit input data (k=4) to be written in parallel and their inverted bits /WD1 to /WD4 to each memory block.

The row decoder 20 produces memory block selection signals YRS1 to YRSN for selecting one of the N memory block rows. The memory block selection signals YRS1 to YRSN respectively correspond to the N memory block rows. The row decoder 20 activates a corresponding one of the memory block selection signals YRS1 to YRSN in order to select a memory block row corresponding to the write word line WWL selectively activated according to the row selection result.

With such a structure, the data write current Iw can be supplied to the local data write current supply line pairs LWSLP corresponding to the memory block column selected according to the column selection result. Furthermore, memory block selection gates in each memory block are turned ON according to the row selection result. As a result, the data write current Iw can be supplied to the memory block selected for the data write operation according to the row and column selection results.

Figure 19:
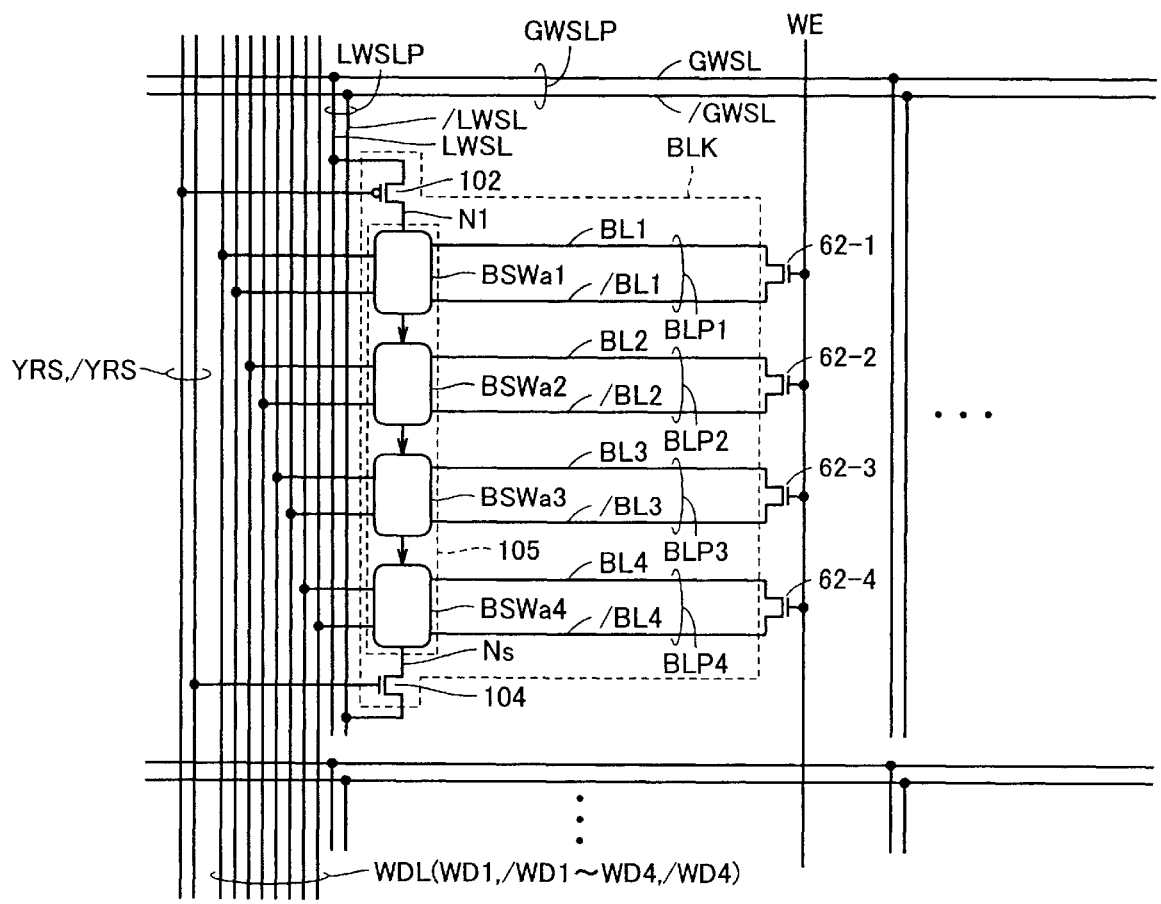
FIG. 19 is a schematic diagram showing the structure of a memory block according to the third embodiment.

Referring to FIG. 19, each memory block BLK includes four (k=4) bit line pairs BLP1 to BLP4. Bit-line current switch units BSWa1 to BSWa4 are provided respectively corresponding to the bit line pairs BLP1 to BLP4.

The global data write current supply line pair GWSLP corresponding to the memory block column of the memory block BLK has global data write current supply lines GWSL and /GWSL. The data write current supply circuit 52 sets the global data write current supply lines GWSL and /GWSL of the memory block column corresponding to the selected memory cell column to the power supply voltage Vcc and the ground voltage Vss, respectively.

The local data write current supply line pair LWSLP corresponding to the memory block BLK has local data write current supply lines LWSL and /LWSL that are respectively coupled to the global data write current supply lines GWSL and /GWSL.

The memory block selection gate 102 is electrically coupled between the local data write current supply line LWSL and the node N1. The memory block selection gate 104 is electrically coupled between the node Ns and the local data write current supply line /LWSL.

When the memory block row of the memory block BLK is selected, the memory block selection gates 102 and 104 are turned ON or OFF in response to the respective memory block selection signals /YRS and YRS activated to L level and H level, respectively.

Each of the bit line current switch units BSWa1 to BSWa4 controls the direction of a reciprocating current in a corresponding bit line pair, according to the input data bits WD1 to WD4 and their inverted bits /WD1 to IWD4 that are transmitted through the write data transmission lines WDL.

With such a structure, the memory blocks capable of simultaneously writing the data of a plurality of bits (k bits) can be efficiently arranged on the memory array, as well as the wirings for supplying the data write current Iw to these memory blocks can be efficiently arranged in a hierarchical manner. As a result, an MRAM device suitable for logic-mounted memory applications such as a system LSI can be implemented.

Moreover, the data write current Iw is supplied using the data write current supply circuit 52 as described in the second embodiment. Accordingly, variation in data write current Iw resulting from variation in temperature conditions, variation in power supply voltage Vcc and process variation can be prevented, whereby the data write margin can be ensured.

Fourth Embodiment

In the fourth embodiment of the present invention, the bit line pairs corresponding to the respective memory cell columns are divided into a plurality of sub bit line pairs along the longitudinal direction so that the data is written in parallel through each sub bit line pair.

Figure 20:
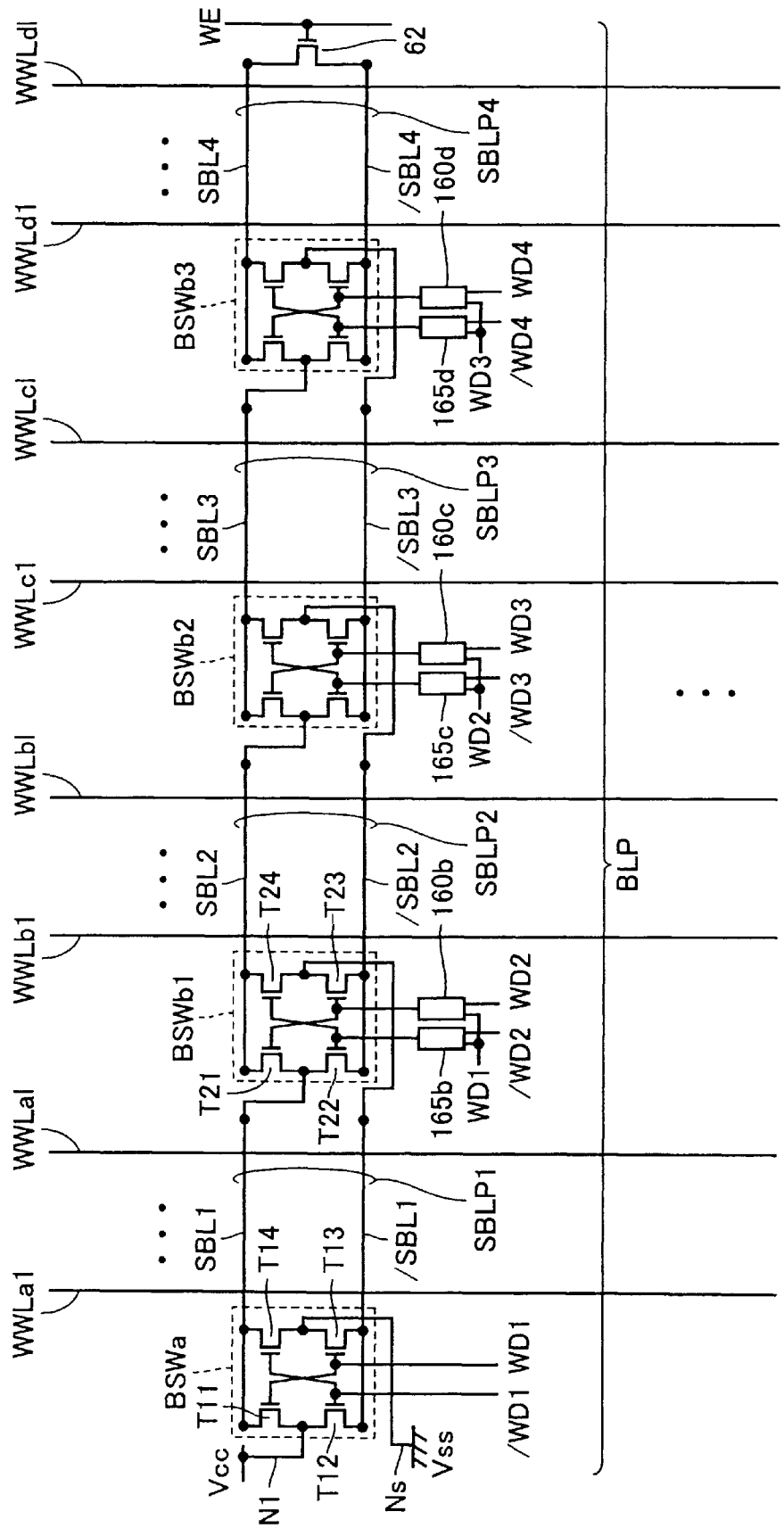
FIG. 20 is a circuit diagram illustrating division of a bit line pair and arrangement of corresponding bit-line current switch units according to a fourth embodiment of the present invention.

FIG. 20 exemplarily illustrates division of a single bit line pair BLP and arrangement of the corresponding bit line current switch units.

In the structure of the fourth embodiment, each bit line pair BLP is divided into h sub bit line pairs (where h is an integer equal to or larger than 2), so that h-bit data can be written in parallel in a single bit line pair, i.e., a single memory cell column.

The fourth embodiment will be exemplarily described for h=4. Therefore, the bit line pair BLP is divided into four sub bit line pairs SBLP1 to SBLP4. Note that, according to the present invention, the number of sub bit line pairs divided from each bit line pair, i.e., h, may be any integer equal to or larger than 2.

In the entire memory array 10, n write word lines WWL are provided corresponding to the respective memory cell rows. These n write word lines WWL are divided into h groups respectively corresponding to the h sub bit line pairs. In the data write operation, a single write word line corresponding to the row selection result is activated in every group. In the structure of FIG. 20, the write word lines WWL are divided into four (h) groups of WWLa1 to WWLal, WWLb1 to WWLbl, WWLc1 to WWLcl, and WWLd1 to WWLdl (where l is a natural number given by n/h). In the data write operation, one of the l write word lines is activated in every group according to the row selection result.

The sub bit line pair SBLP1 is formed from complementary sub bit lines SBL1 and /SBL1. Similarly, the sub bit line pair SBLP2 is formed from complementary sub bit lines SBL2 and /SBL2, the sub bit line pair SBLP3 is formed from complementary sub bit lines SBL3 and /SBL3, and the sub bit line pair SBLP4 is formed from complementary sub bit lines SBL4 and /SBL4.

The sub bit line pair SBLP1 located at one end of the bit line pair BLP is coupled through the bit-line current switch unit BSWa to the node N1 for transmitting the power supply voltage Vcc and the node Ns for transmitting the ground voltage Vss. When the bit line pair is selected for the data write operation, the nodes N1 and Ns are respectively coupled to the power supply voltage Vcc and the ground voltage Vss through a not-shown column selection gate.

A bit-line current switch unit BSWb is provided between adjacent sub bit line pairs. More specifically, a bit-line current switch unit BSWb1 is provided between the sub bit line pairs SBLP1 and SBLP2, a bit-line current switch unit BSWb2 is provided between the sub bit line pairs SBLP2 and SBLP3, and a bit-line current switch unit BSWb3 is provided between the sub bit line pairs SBLP3 and SBLP4.

Sub bit lines SBL4 and /SBL4 of the sub bit line pair SBLP4 located at the other end of the bit line pair BLP are electrically coupled to each other through the bit-line coupling transistor 62.

The bit-line current switch unit BSWa has the same structure as that described in the first embodiment, and includes transistor switches T11 and T12 electrically coupled between the node N1 and the sub bit lines SBL1 and /SBL1, and transistor switches T13 and T14 electrically coupled between the sub bit lines /SBL1 and SBL1 and the node Ns, respectively. An input data bit WD1 is input to the gates of the transistor switches T11 and T13, and an inverted bit /WD1 thereof is input to the gates of the transistor switches T12 and T14.

Accordingly, when the level of the input data bit WD1 is "1", the transistor switches T11 and T13 are turned ON as well as the transistor switches T12 and T14 are turned OFF. On the contrary, when the level of the input data bit WD1 is "0", the transistor switches T12 and T14 are turned ON as well as the transistor switches T11 and T13 are turned OFF.

The bit-line current switch unit BSWb1 includes transistor switches T21 and T22 electrically coupled between the sub bit line SBL1 and the sub bit lines SBL2 and /SBL2, and transistor switches T23 and T24 electrically coupled between the sub bit lines SBL2 and /SBL2 and the sub bit line /SBL1 of the previous stage.

An output signal of a match comparison gate 160b is input to the gates of the transistor switches T21 and T23. The match comparison gate 160b outputs the match comparison result between the input data bit WD2 to be written through the sub bit line pair SBLP2 and the input data bit WD1 to be written through the sub bit line pair SBLP1 of the previous stage.

An output signal of a match comparison gate 165b is input to the gates of the transistor switches T22 and T24. The match comparison gate 165b outputs the match comparison result between the input data bit WD1 and the inverted bit /WD2 of the input data bit WD2.

Accordingly, when the level of the input data bit WD2 of the corresponding sub bit line pair SBLP2 matches the level of the input data bit WD1 of the adjacent sub bit line pair SLBP1 of the previous stage, the transistor switches T21 and T23 of the bit-line current switch unit BSWb1 are turned ON as well as the transistor switches T22 and T24 thereof are turned OFF. When these input data bits do not match each other, the transistor switches T22 and T24 are turned ON as well as the transistor switches T21 and T23 are turned OFF.

Bit-line current switch units BSWb2 and BSWb3 have the same structure as that of the bit-line current switch unit BSWb 1. The transistor switches of the bit-line current switch unit BSWb2 are turned ON/OFF by match comparison gates 160c and 165c based on whether or not the input data bits WD2 and WD3 match each other. Similarly, the transistor switches of the bit-line current switch unit BSWb3 are turned ON/OFF by match comparison gates 160d and 165d based on whether or not the input data bits WD3 and WD4 match each other.

Note that, hereinafter, the bit-line current switch units BSWb1 to BSWb3 are also generally referred to as bit-line current switch unit BSWb. The bit-line current switch unit BSWb compares the level of the respective input data bits of the corresponding sub bit line pair and adjacent sub bit line pair, and controls the direction of the data write current supplied to the corresponding sub bit line pair according to the comparison result.

Figure 21:
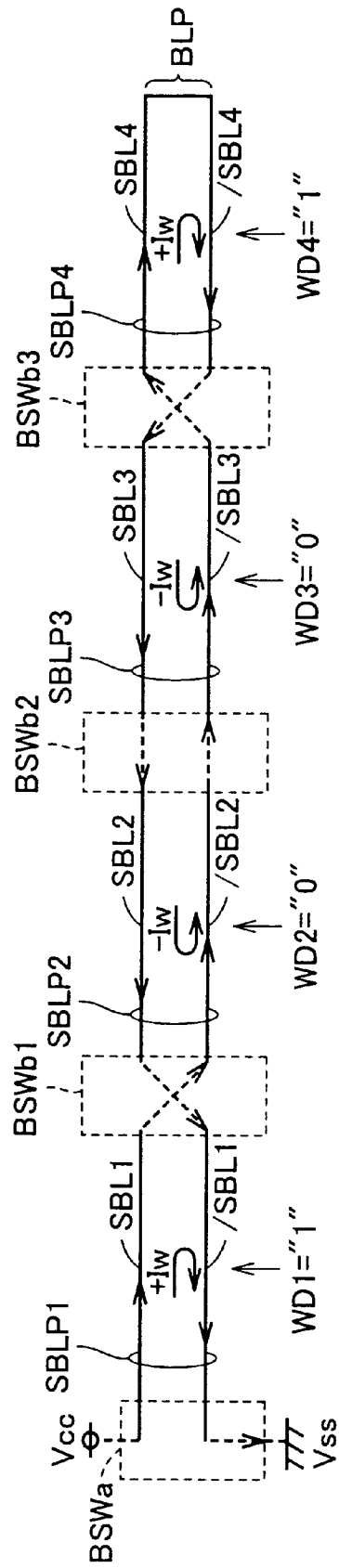
FIG. 21 is a conceptual diagram illustrating the operation of a bit-line current switch unit of FIG. 18.

Referring to FIG. 21, it is herein assumed that the levels of the input data bits WD1, WD2, WD3 and WD4 to be written through the sub bit line pairs SBLP1, SBLP2, SBLP3 and SBLP4 are "1", "0", "0" and "1", respectively.

In this case, the bit-line current switch unit BSWa couples the node N1 to the sub bit line SBL1, and couples the node Ns to the sub bit line /SBL1. As a result, a reciprocating current +Iw for writing the storage data of level "1" flows through the sub bit lines SBL1 and /SBL1 of the sub bit line pair SBLP1.

Since the input data bits WD2 and WD1 have different levels, the bit-line current switch unit BSWb1 electrically couples the sub bit lines SBL1 and /SBL1 to the sub bit lines /SBL2 and SBL2, respectively. As a result, a data write current flows through the sub bit lines SBL2 and /SBL2 of the sub bit line pair SBLP2 as a reciprocating current in the opposite direction (−Iw) to that of the data write current (+Iw) flowing through the sub bit lines SBL1 and /SBL1 of the sub bit line pair SBLP1.

Since the input data bits WD2 and WD3 to be respectively written through the sub bit line pairs SBLP2 and SBLP3 have the same level, the bit-line current switch unit BSWb2 electrically couples the sub bit lines SBL3 and /SBL3 to the sub bit lines SBL2 and /SBL2 of the sub bit line pair SBLP2 of the previous stage, respectively. As a result, a data write current flows through the sub bit lines SBL3 and /SBL3 of the sub bit line pair SBLP3 as a reciprocating current in the same direction (−Iw) as that of the data write current flowing through the sub bit lines SBL2 and /SBL2 of the sub bit line pair SBLP2.

Since the input data bits WD4 and WD3 to be respectively written through the sub bit line pairs SBLP4 and SBLP3 have different levels, the bit-line current switch unit BSWb3 electrically couples the sub bit lines SBL4 and /SBL4 to the sub bit lines /SBL3 and SBL3 of the sub bit line pair SBLP3 of the previous stage, respectively. As a result, a data write current flows through the sub bit lines SBL4 and /SBL4 of the sub bit line pair SBLP4 as a reciprocating current in the same direction (+Iw) as that of the data write current flowing through the sub bit lines SBL1 and /SBL1 of the sub bit line pair SBLP1.

The respective one ends of the sub bit lines SBL4 and /SBL4, which are not coupled to the bit-line current switch unit BSWb3, are electrically coupled to each other through the bit-line coupling transistor 62.

Thus, a reciprocating current of the direction corresponding to the level of the input data bit WD1 is applied to the sub bit line pair SBLP1. Regarding each of the following sub bit line pairs SBLP2 to SBLP4, connection with the bit line pair of the previous stage is switched according to the comparison of the level between the input data bits, whereby a reciprocating current corresponding to the level of the respective input data bit WD2 to WD4 can be supplied.

With such a structure, a bit-line current switching portion formed from the bit-line current switch units BSWb1 to BSWb3 and BSWa can couple the sub bit lines SBL1 to SBL4 and /SBL1 to /SBL4 in series between the nodes N1 and Ns so that the data write current flows through the four (h) sub bit line pairs in the direction corresponding to the respective input data bits WD1 to WD4.

Thus, the data write current Iw is supplied through a current path formed from the series-connected sub bit line pairs, whereby a plurality of bits can be written in parallel. In other words, the data write current can be reduced to ¼ (1/h) of that in the case of supplying the data write current Iw independently to each sub bit line pair. This allows for reduced power consumption of the MRAM device as well as stabilized operation thereof due to the reduced magnetic field noise generated in the data write operation.

Fifth Embodiment

The fifth embodiment of the present embodiment is based on a combination of the first and fourth embodiments. More specifically, each of a plurality of bit line pairs in a memory block is further divided into a plurality of sub bit line pairs.

Figure 22:
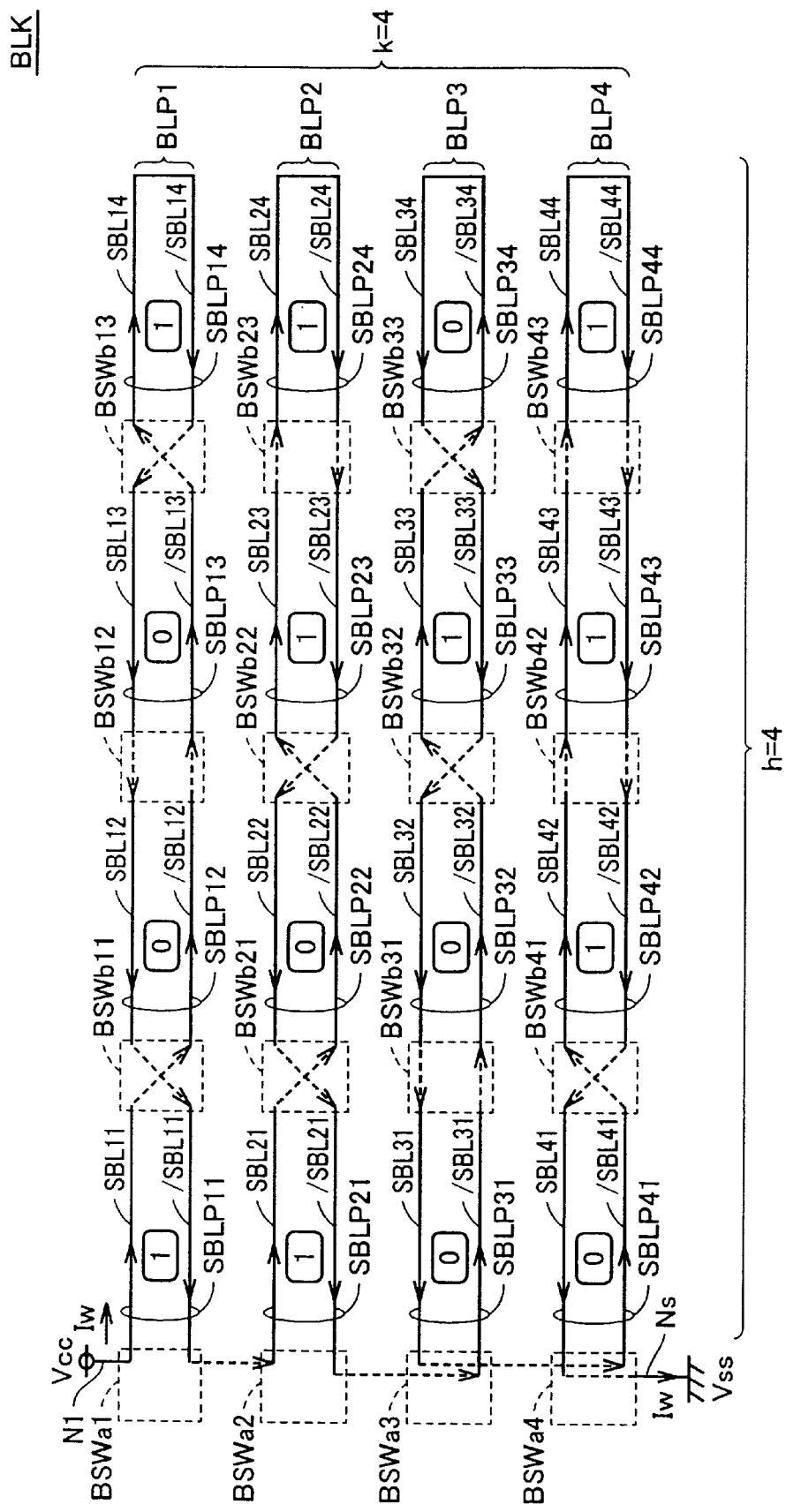
FIG. 22 is a conceptual diagram showing the structure of a memory block according to a fifth embodiment of the present invention.

Referring to FIG. 22, in the fifth embodiment, it is assumed that each memory block includes four bit line pairs (i.e., k=4) and each bit line pair is divided into four sub-bit line pairs (i.e., h=4).

A memory block BLK exemplarily shown in FIG. 22 includes four bit line pairs BLP1 to BLP4. Each bit line pair is divided into four sub bit line pairs. For example, the first bit line pair BLP1 is divided into four sub bit line pairs SBLP11 to SBLP14. Each sub bit line pair is formed from complementary sub bit lines. For example, the sub bit line pair SBLP11 is formed from sub bit lines SBL11 and /SBL11.

In each memory cell column, a bit-line current switch unit is provided for the sub bit line pair located at one end of each bit line pair. More specifically, in FIG. 22, bit-line current switch units BSWa1 to BSWa4 are respectively provided for the sub bit line pairs SBLP11, SBLP21, SBLP31 and SBLP41. The bit-line current switch units BSWa1 to BSWa4 have the same structure as that of the bit-line current switch unit BSWa described in the first embodiment.

Moreover, in each bit line pair, the bit-line current switch unit BSWb described in the fourth embodiment is provided between every adjacent sub bit line pairs. For example, in the bit line pair BLP1, a bit-line current switch unit BSWb11 is provided between the sub-bit line pairs SBLP11 and SBLP12, a bit-line current switch unit BSWb12 is provided between the sub-bit line pairs SBLP12 and SBLP13, and a bit-line current switch unit BSWb13 is provided between the sub-bit line pairs SBLP13 and SBLP14.

For example, in the structure of FIG. 22, the data of "1", "0", "0" and "1" are written to the sub bit line pairs SBLP11, SBLP12, SBLP13 and SBLP14 of the bit line pair BLP1, respectively. In this case, a reciprocating current flows thorough the sub-bit line pairs SBLP11 and SBLP14 in the same direction (+Iw of FIG. 21), and flows through the sub-bit line pairs SBLP12 and SBLP13 in the opposite direction thereto (−Iw of FIG. 21).

Similarly, the data of "1", "0", "1" and "1" are written to the sub bit line pairs SBLP21, SBLP22, SBLP23 and SBLP24 of the bit line pair BLP2, respectively. Accordingly, a reciprocating current flows thorough the sub-bit line pairs SBLP21, SBLP23 and SBLP24 in the same direction (+Iw of FIG. 21), and flows through the sub-bit line pair SBLP12 in the opposite direction thereto (−Iw of FIG. 21).

The data of "0", "0", "1" and "0" are written to the sub bit line pairs SBLP31, SBLP32, SBLP33 and SBLP34 of the bit line pair BLP3, respectively. Accordingly, a reciprocating current flows thorough the sub-bit line pairs SBLP31, SBLP32 and SBLP34 in the same direction (−Iw of FIG. 21), and flows through the sub-bit line pair SBLP33 in the opposite direction thereto (+Iw of FIG. 21).

The data of "0", "1", "1" and "1" are written to the sub bit line pairs SBLP41, SBLP42, SBLP43 and SBLP44 of the bit line pair BLP4, respectively. Accordingly, a reciprocating current flows thorough the sub-bit line pairs SBLP42, SBLP43 and SBLP44 in the same direction (+Iw of FIG. 21), and flows through the sub-bit line pair SBLP41 in the opposite direction thereto (−Iw of FIG. 21).

Thus, according to the memory block of the fifth embodiment, 16-bit data (4×4=16), i.e., (k×h)-bit data, can be written in parallel through the respective sub bit line pairs by using a single data write current Iw supplied between the power supply voltage Vcc and the ground voltage Vss. Accordingly, the data write current can be reduced to $1/16$, i.e., $1/(k \times h)$ of that in the conventional case of supplying the data write current independently to each of the sub bit line pairs selected for the data write operation. Thus, significant reduction in the data write current can be achieved.

This allows for reduced current consumption of the MRAM device as well as stabilized operation thereof due to the reduced magnetic field noise in the data write operation.

Thus, according to the fifth embodiment, a further increased number of bits can be written in parallel while suppressing the current consumption.

Note that, by combining the fifth embodiment with the second embodiment, the data write current Iw supplied to each memory block can be controlled to a constant current by the data write current supply circuit 52. It is also possible to arrange a plurality of memory blocks having the structure of the fifth embodiment in rows and columns in order to supply the data write current Iw through the wirings provided in a hierarchical manner as in the third embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device capable of writing input data of a plurality of bits in parallel, comprising:
    a memory array including a plurality of magnetic memory cells arranged in rows and columns, wherein
        each of said plurality of magnetic memory cells includes a storage portion having an electric resistance value varying according to a data level that is written according to combination of first and second data write magnetic fields respectively applied by first and second data write currents,
        said memory array is divided into a plurality of memory blocks, one of said plurality of memory blocks being selected in a data write operation, and
        each of said plurality of memory blocks includes
            k first bit lines respectively corresponding to the columns of said plurality of magnetic memory cells, for passing said first data write current therethrough (where k is an integer at least 2),
            a block selection gate for coupling first and second nodes to first and second voltages, respectively, when a corresponding one of said plurality of memory blocks is selected, and
            a first bit-line current switching portion for connecting said k first bit lines in series between said first and second nodes in said data write operation so that said first data write current flows through each of said k first bit lines in a direction corresponding to a respective data level of k-bit input data, said thin film magnetic memory device further comprising:
                a plurality of write word lines respectively corresponding to the rows of said magnetic memory cells, and selectively activated in said data write operation according to a row selection result, for passing said second data write current therethrough.

2. The thin film magnetic memory device according to claim 1, wherein each of said plurality of memory blocks further includes
    k second bit lines respectively corresponding to said k first bit lines, and each forming a bit line pair with a corresponding one of said k first bit lines, the thin film magnetic memory device further comprising:
        a bit-line coupling portion provided for every bit line pair, for electrically coupling a corresponding one of said k first bit lines and a corresponding one of said k second bit lines to each other at their respective one ends at least in the memory block selected for said data write operation,
        said first bit-line current switching portion connects the corresponding k bit line pairs in series between said first and second nodes so as to form, in the k bit line pairs, k reciprocating-current paths each having a direction corresponding to the respective data level of said k-bit input data.

3. The thin film magnetic memory device according to claim 2, wherein
    said first bit-line current switching portion includes k first current switch units respectively corresponding to said k bit line pairs, and
    each of said first current switch units selectively couples a third node receiving said first data write current to be supplied to a corresponding one of said k bit line pairs and a fourth node receiving said first data write current from the corresponding bit line pair to the other ends of said first and second bit lines of the corresponding bit line pair, respectively, according to the data level of corresponding one bit of said k-bit input data.

4. The thin film magnetic memory device according to claim 2, wherein said plurality of magnetic memory cells are arranged so that the magnetic memory cells of each row are respectively coupled to one of said first and second bit lines.

5. The thin film magnetic memory device according to claim 2, wherein
    said plurality of magnetic memory cells are provided at respective intersections with said first and second bit lines in each row, and
    in each row, complementary data levels are respectively written to two magnetic memory cells that are respectively coupled to the first and second bit lines of the same bit line pair, whereby one-bit data is stored therein.

6. The thin film magnetic memory device according to claim 1, wherein
    in each of said plurality of memory blocks, each of said k first bit lines is divided into h sub bit lines (where h is an integer equal to or larger than 2),
    said plurality of write word lines are divided into h groups respectively corresponding to said h sub bit lines, and one of the write word lines is selected in each of said h groups according to said row selection result,
    each of said plurality of memory blocks further includes k second bit-line current switching portions respectively corresponding said k first bit lines, and
    each of said second bit-line current switching portions couples said h sub bit lines in series between a third node receiving said first data write current to be supplied to a corresponding one of said k first bit lines and a fourth node receiving said first data write current from the corresponding first bit line, the coupling of said h sub bit lines in series between said third and fourth nodes being conducted so that said first data write current flows through each of the h sub bit lines of the corresponding first bit line in a direction corresponding to a respective level of h-bit input data to be written through the corresponding first bit line.

7. The thin film magnetic memory device according to claim 1, wherein said plurality of memory blocks are arranged in rows and columns in said memory array, said thin film magnetic memory device further comprising:

a plurality of global write current supply line pairs each extending in a column direction and provided in common to the memory blocks located adjacent to each other in the column direction; and a plurality of local write current supply line pairs each extending in a row direction and provided respectively corresponding said plurality of memory blocks, wherein each of said global write current supply line pairs includes a first global write current supply line for transmitting said first voltage in said data write operation, and a second global write current supply line for transmitting said second voltage in said data write operation, and each of said local write current supply line pairs includes a first local write current supply line coupled to the first global write current supply line of a corresponding one of said plurality of global write current supply line pairs, and a second local write current supply line coupled to the second global write current supply line of a corresponding one of said plurality of global write current supply line pairs.

8. The thin film magnetic memory device according to claim 7, further comprising a selector circuit for selectively transmitting said first and second voltages to the first and second global write current supply lines of one of said plurality of global write current supply line pairs in said data write operation, said one of said plurality of global write current supply line pairs being selected according to a column selection result.

9. The thin film magnetic memory device according to claim 1, further comprising a data write current supply circuit for supplying said first data write current, said data write current supply circuit including a current source for supplying a predetermined constant current, a first voltage driving circuit driven by said constant current from said current source, for outputting said first voltage, and a second voltage driving circuit driven by said constant current from said current source, for outputting said second voltage.

10. The thin film magnetic memory device according to claim 1, wherein each of said magnetic memory cells further includes a memory cell selection gate selectively turned ON according to said row selection result in a data read operation, for supplying to said storage portion a data read current supplied to said first bit lines, and said memory cell selection gate includes a diode that is forward-biased in response to said turning-ON of said memory cell selection gate.

11. A thin film magnetic memory device capable of writing input data of a plurality of bits in parallel, comprising:

a memory array including a plurality of magnetic memory cells arranged in rows and columns, each of said plurality of magnetic memory cells including a storage portion having a resistance value varying according to a data level that is written according to combination of first and second data write magnetic fields respectively applied by first and second data write currents;

a plurality of first bit lines respectively corresponding to the columns of said plurality of magnetic memory cells, for passing said first data write current therethrough according to a column selection result, each of said first bit lines being divided into h first sub bit lines;

a plurality of write word lines respectively corresponding to the rows of said magnetic memory cells, and selectively activated in a data write operation according to a row selection result, for passing said second data write current therethrough, said plurality of write word lines being divided into h groups respectively corresponding to said h first sub bit lines, and one of the write word lines being activated in each of said h groups according to said row selection result; and a bit-line current switching portion provided for every first bit line, each of said bit-line current switching portions coupling the corresponding h first sub bit lines in series between a first node receiving said first data write current to be supplied to a corresponding one of said plurality of first bit lines and a second node receiving said first data write current from the corresponding first bit line, and the coupling of the h first sub bit lines in series between said first and second nodes being conducted so that said first data write current flows through each of the h first sub bit lines of the corresponding first bit line in a direction corresponding to a respective data level of h-bit input data to be written through said corresponding first bit line.

12. The thin film magnetic memory device according to claim 11, further comprising:

a plurality of second bit lines respectively corresponding to said plurality of first bit lines, and each forming a bit line pair with a corresponding one of said plurality of first bit lines, wherein each of said second bit lines is divided into h second sub bit lines respectively corresponding to said h first sub bit lines, and each forming a sub bit line pair with a corresponding one of said h first sub bit lines, the thin film magnetic memory device further comprising:

a bit-line coupling portion provided for every bit line pair, for electrically coupling one of the corresponding h first sub bit lines and one of the corresponding h second sub bit lines to each other at their respective one ends, said one of the corresponding h first sub bit lines and said one of the corresponding h second sub bit lines are located at one end of the first and second bit lines, respectively, wherein each of said bit-line current switching portions connects the corresponding h first and second sub bit lines in series between said first and second nodes so as to form, in the h sub bit line pairs of a corresponding bit line pair, h reciprocating-current paths each having a direction corresponding to the respective data level of said h-bit input data.

13. The thin film magnetic memory device according to claim 12, wherein each of said bit-line current switching portions includes a first current switch unit provided for one of the corresponding h first sub bit lines and one of the corresponding h second sub bit lines, said one of the corresponding h first sub bit lines and said one of the corresponding h second sub bit lines being located at the other end of the first and second bit lines, respectively, and a second current switch unit provided between every adjacent sub bit line pairs, wherein said first current switch unit selectively couples said first and second nodes to the corresponding first and second sub bit lines, respectively, according to a level of one-bit data of said h-bit input data, which is to be written through the corresponding first and second sub bit lines, and said second current switch unit selectively couples the first and second sub bit lines of one of the corresponding adjacent sub bit line pairs to the first and second sub bit lines of the other sub bit line pair, respectively, according to a match comparison result between levels of two-bit data of said h-bit input data, which are to be written through the adjacent sub bit line pairs.

14. The thin film magnetic memory device according to claim 12, wherein said plurality of magnetic memory cells are arranged so that the magnetic memory cells of each row are respectively coupled to one of said first and second bit lines.

15. The thin film magnetic memory device according to claim 12, wherein said plurality of magnetic memory cells are provided at respective intersections with said first and second bit lines in each row, and in each row, complementary data levels are respectively written to two magnetic memory cells that are respectively coupled to the first and second bit lines of the same bit line pair, whereby one-bit data is stored therein.

16. The thin film magnetic memory device according to claim 11, further comprising a data write current supply circuit for supplying said first data write current, said data write current supply circuit including a current source for supplying a predetermined constant current, a first voltage driving circuit driven by said constant current from said current source, for outputting said first voltage, and a second voltage driving circuit driven by said constant current from said current source, for outputting said second voltage.

17. The thin film magnetic memory device according to claim 11, wherein each of said magnetic memory cells further includes a memory cell selection gate selectively turned ON according to said row selection result in a data read operation, for supplying to said storage portion a data read current supplied to said first bit lines, and said memory cell selection gate includes a diode that is forward-biased in response to said turning-ON of said memory cell selection gate.

18. A thin film magnetic memory device capable of writing input data of a plurality of bits in parallel, comprising a memory array including:

a plurality of magnetic memory cells arranged in rows and columns, wherein each of said plurality of magnetic memory cells includes a storage portion to which data is written according to a magnetic field applied by a data write current corresponding to the data;

said memory array further including:

a plurality of bit lines for passing said data write current therethrough; and a bit-line current switching portion for connecting selected k bit lines (where k is an integer of at least 2) of said plurality of bit lines in series so as to apply said data write current to each of said k bit lines in a direction corresponding to a respective data level of k-bit input data.

19. A thin film magnetic memory device comprising:

a memory array including a plurality of magnetic memory cells arranged in rows and columns, each of said plurality of magnetic memory cells including a storage portion to which data is written according to a magnetic field applied by a data write current corresponding to the data;

a plurality of read select lines provided respectively corresponding to said rows and for selecting said rows in a data read operation; and a plurality of bit line pairs provided respectively corresponding to said columns, and each including first and second bit lines; wherein said plurality of magnetic memory cells are arranged such that all of the magnetic memory cells included in a selected row are electrically connected to one of said first and second bit lines in said data read operation.

20. The thin film magnetic memory device according to claim 19, wherein said memory array further includes a plurality of dummy memory cells each provided for comparison with a selected magnetic memory cell in a data read operation;

said plurality of dummy memory cells are arranged along said rows; and at least one of said plurality of dummy memory cells is electrically connected to the other of said first and second bit lines.

21. The thin film magnetic memory device according to claim 19, further comprising:

a bit-line coupling portion provided for each of said bit line pairs, for electrically coupling one end of the corresponding first bit line and one end of the corresponding second bit line to each other at least in a column selected for a data write operation; and a data write circuit electrically coupled to the first and second bit lines coupled by said bit-line coupling portion in said data write operation, for providing said data write current having a direction corresponding to a level of the data.

22. A thin film magnetic memory device comprising:

a memory array including a plurality of magnetic memory cells arranged in rows and columns, each of said plurality of magnetic memory cells including a storage portion to which data is written according to a magnetic field applied by a data write current corresponding to the data;

a plurality of bit line pairs provided respectively corresponding to said columns, each including first and second bit lines;

a bit-line coupling portion provided for each of said bit line pairs, for electrically coupling one end of the corresponding first bit line and one end of the corresponding second bit line to each other at least in a column selected for a data write operation; and a data write circuit electrically coupled to the first and second bit lines coupled by said bit-line coupling portion in a data write operation, for providing said data write current having a direction corresponding to a level of the data; wherein each of said plurality of magnetic memory cells is electrically connected to one of said first and second bit lines in each of said rows.

* * * * *